US007508191B2

(12) United States Patent
Roberts

(10) Patent No.: US 7,508,191 B2
(45) Date of Patent: Mar. 24, 2009

(54) PIN ELECTRONICS IMPLEMENTED SYSTEM AND METHOD FOR REDUCED INDEX TIME

(76) Inventor: Howard Roberts, 4519 Ave. D, Austin, TX (US) 78751

( * ) Notice: Subject to any disclaimer, the term of this patent is extended or adjusted under 35 U.S.C. 154(b) by 0 days.

(21) Appl. No.: 11/264,949

(22) Filed: Nov. 1, 2005

(65) Prior Publication Data

US 2006/0061377 A1 Mar. 23, 2006

Related U.S. Application Data

(63) Continuation-in-part of application No. 10/767,932, filed on Jan. 29, 2004, now Pat. No. 7,183,785.

(51) Int. Cl.
*G01R 31/28* (2006.01)
(52) U.S. Cl. .................................. 324/158.1
(58) Field of Classification Search ....................... None
See application file for complete search history.

(56) References Cited

U.S. PATENT DOCUMENTS

| | | | |
|---|---|---|---|
| 5,650,732 A | 7/1997 | Sakai | 324/755 |
| 5,968,193 A * | 10/1999 | Ang | 714/724 |
| 6,225,798 B1 * | 5/2001 | Onishi et al. | 324/158.1 |
| 6,515,470 B2 | 2/2003 | Suzuki et al. | 324/158.1 |
| 6,831,454 B2 | 12/2004 | Bae et al. | 324/158.1 |
| 6,958,617 B1 | 10/2005 | Rhodes | |
| 2004/0143411 A1 | 7/2004 | Wu | 702/117 |

FOREIGN PATENT DOCUMENTS

WO  WO 03/005041 A3 * 1/2003

OTHER PUBLICATIONS

PCT Notification of Transmittal of the International Search Report and the Written Opinion of the International Searching Authority, dated Jan. 20, 2006.

* cited by examiner

*Primary Examiner*—Ha Tran T Nguyen
*Assistant Examiner*—Roberto Velez
(74) *Attorney, Agent, or Firm*—The Law Firm of H. Dale Langley, Jr., P.C.

(57) ABSTRACT

A system for testing with an automated test equipment (ATE) includes a tester having first and second manipulator arms. The tester has a pin electronics card. The pin electronics card includes a tester channel for connecting to a single pin of a device under test. The pin electronics card also includes a muxing relay connected to the tester channel, a first lead of the muxing relay, for connecting to a single pin of a first device under test, and a second lead of the muxing relay, for connecting to a single pin of a second device under test. The muxing relay electrically switches from testing of the first device under test to testing of the second device under test, and vice versa. respectively, with negligible index time.

5 Claims, 14 Drawing Sheets

PIN ELECTRONICS IMPLEMENTED SYSTEM AND METHOD FOR REDUCED INDEX TIME

CROSS-REFERENCE TO RELATED APPLICATIONS

The present application is related to and is a continuation-in-part of U.S. patent application Ser. No. 10/767,932, titled "Test System and Method for Reduced Index Time", filed Jan. 29, 2004, now U.S. Pat. No. 7,183,785 of the same inventors hereof, and that application is incorporated herein.

BACKGROUND OF THE INVENTION

The present invention generally relates to automated manufacture systems and methods and, more particularly, relates to automated and robotic semiconductor equipment systems and methods, particularly for testing and quality control, and improvements thereto, including reduction of index timing delays and the like.

Automated manufacturing equipment has streamlined the manufacturing process in many industries. Moreover, such automation has increased reliability and results. A downside of automation has been timing delays in equipment operations. Particularly, where expensive manufacturing equipment is involved, delays in operations of the equipment, such as during mechanical movements in transferring devices under test, limit returns on the costs of such equipment because of idle or non-testing use periods during mechanical manipulations, resets, and the like. An impetus in manufacturing technology and operations has, therefore, been to limit times in which costly test equipment is idle and not performing the applicable test function, for example, when robotically substituting next test pieces.

In semiconductor manufacture, semiconductor device test equipment is a costly capital requirement. Conventionally, such test equipment has included a robotic manipulator for handling the devices being tested. This robotic manipulator system is commonly referred to as a "handler" and is typically configured with one or more robotic arms referred to as "manipulators." The manipulator mechanically picks up a device for testing, inserts the device into an interface test board socket and issues a start-of-test signal to the tester. The tester then conducts a test on the device and returns a test result and an end-of-test signal to the handler which causes the handler to disposition the device to a post-test tray or receptacle for holding tested devices. This process is repeated as long as the handler senses that there are additional devices available for test. This system as a whole is sometimes referred to as a "test cell."

During the time required for the handler to disposition a device(s) just tested and replace it with the next device(s) to be tested, the tester remains substantially idle. This idle time, sometimes referred to as the "index time" for the particular tester and system, involves mechanical manipulations of the devices awaiting test and having been tested. These mechanical manipulations are limited in speed of operations by various factors, including, for example, physical and speed constraints to ensure that devices to be tested are not damaged, contaminated, dropped, and the like.

The time required to test a device is sometimes referred to as "test time" for a particular device, test, tester, and system. When the system is operational in a manufacturing capacity, it is either indexing during the index time or otherwise testing during the test time.

Previously, test equipment manufacturers have focused efforts to reduce index time on design of manipulation equipment to increase speed of mechanical operations. Although speeds of mechanical operations in handling the test devices have increased significantly over time, there nonetheless remains significant mechanical index time required to manipulate test devices between tests, by the robotic handlers. Moreover, with increased speeds of mechanical manipulation equipment operations, costs increase for the equipment, including calibration, replacement frequency, maintenance, parts, and others. Given the constraints and precautions that must be addressed in speeding mechanical manipulations of many types of test devices and handlers, further speeding of mechanical operations is subject to economic and physical barriers.

In any event, reducing index time can provide greater returns on investments in test equipment, particularly where the test equipment is costly. It would, therefore, be a significant improvement in the art and technology to further reduce index time involved in test operations in manufacturing environments. Particularly in semiconductor manufacture, economic and other gains and advantages are possible if index times are reduced in the testing of semiconductor devices. It would also be an improvement to provide new and improved systems and methods for achieving reduced index times, without requiring substantial changes or new developments in existing mechanical operations of device handlers and similar robotic or automated components for the testing.

For purposes of background understanding, conventional testing systems and operations are now described:

Referring to FIG. 1, a conventional system 100 for testing a device 102 includes a tester 104, an interface board 106 connected to the tester 104 that makes available the tester 104 resources (e.g., testing protocols, signals, and procedures run by the tester) to the device 102 under test, and a robotic handler 108. It is to be understood that the device 102 can be a single device or multiple devices simultaneously connected to the tester and tester resources for concurrent testing operations, but that the singular term "device" is used herein to refer to devices that are so simultaneously connected and concurrently tested. The robotic handler 108 is communicatively connected to the tester 104. The interface board 106 is communicatively connected to the tester 104. The interface board 106 includes one test socket 110 for receiving and maintaining the device 102 during testing.

The test socket 110 provides a physical mechanism that assists the manipulator arm 109 in the alignment of the device 102 under test, so that electrical contact between the device 102 under test and the tester 104 is adequately maintained while the device 102 is undergoing electrical test. Typically the precision of the manipulator arm 109 is too course to provide and maintain proper electrical contact between the device 102 under test and the tester 104 and relevant tester resources, and it is the test socket 110 which provides the mechanics of fine alignment required to maintain proper electrical contact during test.

Furthermore, a single interface board can have more than one test socket. When multiple sockets are present on the interface board, each socket has been typically connected to respective distinct sets of tester resources from a single tester 104. In effect, the tester 104 can perform different tests on each socket, but not the same tests on each socket concurrently. There can be certain exceptions, in special cases, where the tester resources can drive signals from the tester to multiple devices at the same time. Such resources include power supplies, digital drivers, and analog waveform generators. In each case the resource is considered an output resource from the particular tester, and the tester in such use must be specially configured and have functionality required to perform the separate distinct testing in concurrent manner. Most conventional testers do not have such special configuration or functionality and, in any event, any such special testers can be significantly more expensive and/or limited in application when compared to most conventional testers.

The robotic handler 108 mechanically moves and operates to pick up and handle the device 102, from among one or more devices to be tested. Once the device 102 to be tested is picked-up by the manipulator arm 109, the handler 108 controls the transfer of the device 102 into position in the appropriate socket 110 of the interface board 106. The tester 104 then commences to test the device 102. After the test is completed by the tester 104, the handler 108 mechanically removes the device 102 from the socket 110 and transfers the device 102 to a location of tested devices.

In operations of the conventional system 100, a set of devices to be tested are staged at the input to the handler 108 by a human operator. The operator then instructs the handler 108 to begin retrieving devices to be tested and to stage the next available device by inserting it into the test socket 110. Once the handler 108 has sensed that the first device 102 is in place in the test socket 110 and ready for test, the handler 108 issues a start-of-test signal to the tester 104. In response to the start-of-test signal, the tester 104 executes a test program that electrically stimulates, via the test socket 110, the device 102 under test and measures the output response from the device 102. The tester 104 compares the output response to a set of expected response data and judges the results as either a "pass" or a "fail" of the device 102.

If the interface board contains multiple test sockets and the tester is capable of concurrent testing with different tester resources of the tester, as with the certain specialized tester previously mentioned, the tester must query the handler status to determine which test sockets have devices ready for test and which do not. The tester can then ignore failing test results from empty test sockets and test only active test socket sites with devices inserted. Of course, as previously mentioned, such special testers with these capabilities are relatively uncommon, expensive, and limited in application.

Once the test program has concluded testing for the device 102 and a pass/fail determination of the test results has been made by the tester 104, the tester 104 communicates back to the handler 108 the test result data for the device 102 just tested and follows by an end-of-test signal to the handler 108. The handler 108 receives the end-of-test signal from the tester 104, and the handler 108 uses the test results data to disposition the device 102 just tested into an output staging area for tested devices, such as separate holding areas for passing devices and for failing devices, respectively.

If the interface board contains multiple test sockets and the tester is capable of concurrent testing with different tester resources of the tester, as with the certain specialized tester previously mentioned, the tester must communicate results data for each of the active test socket locations that is site specific and the handler must disposition each of the devices accordingly. Again, any such arrangement requires specialized tester and possibly special handler equipment, and these each have the problems of expense and limited applications.

In ongoing operations of the system 100, once the handler 108 has dispositioned the device 102 just tested, the process repeats in succession until there are no additional untested devices remaining to be tested, or until any error condition in the handler status or tester halts operation, or until a human operator intervenes to halt the testing.

In each case of a test in this conventional system 100, the handler 108 individually obtains and transfers the respective device 102 then being tested. During the mechanical operations of the handler 108 in picking up, setting in the socket 110, and locating after test, the tester 104 remains idle without conducting any test. The index time for the system 100 is substantially the time required for the mechanical operations of the handler 108 when removing and dispositioning the tested device and then retrieving and inserting each next successive untested device for testing. The index time also includes any time interval between the end-of-test signal from the tester 104 to the handler 108 and the next start-of-test signal from the handler 108 to the tester 104.

Referring to FIG. 4, a conventional process 400 for testing a device includes a step 402 of initiating a first manipulator. In the step 402, for example, a signal is communicated to a robotic handler having the first manipulator. The signal is communicated by a tester or other source, to indicate to the handler that the first manipulator should initiate actions to obtain and locate a device for testing. The device is, for example, a semiconductor device or any other manufactured part or element that is to be tested by the particular tester.

In a step 404, the first manipulator mechanically moves its arm to retrieve a first device for testing. The first manipulator grips or otherwise retains the first device. Then, in a step 406, the first manipulator mechanically picks-up and manipulates the first device, for example, appropriately orienting the first device for testing. In a step 408, the first manipulator mechanically moves the first device to an interface board connected to the tester and inserts the first device in a socket or other test cell of the interface board.

Once the first device is located in the socket or other test cell, the tester commences a step 412 of testing of the device. Testing can include power test, logic test, and any of a wide variety of other quality control or device conformance tests. The testing may take some period of time for completion, depending on the test being performed. During the testing, the first manipulator maintains the first device in position at the interface board for the test.

When the testing step 412 is completed, the tester signals to the handler and the first manipulator is activated to mechanically remove the device, in a step 414, from the socket or other test cell. The first manipulator then moves the first device to a desired post-test location in a step 416. In a step 418, the first device is released by the first manipulator at the post-test location.

The process 400 then returns to the step 402, in order to repeat the steps with respect to a next test device and a next test of the device. As previously mentioned, the time during the process 400 required for the operations of the first manipulator of the handler to pick-up, move, place, remove and dispense of each device, is referred to as the "index time" for the test system. During the index time of operations of the first manipulator, the tester remains in an idle state in which no test is being conducted. The index time that is required in such process 400 delays and limits the entire process 400.

Referring to FIG. 13, conventional testers include pin electronics cards 1302 that provide for the various tests performable by the tester, both analog and/or digital. Each pin electronics card 1302 contains one or more test resources, represented by the blocks 1302*a-c*. The test resources of each pin electronics card 1302 can include different, more, less or other elements from those of blocks 1302*a-c*, which are solely for example purposes, including, without limitation, such as the following:

1. a driver that drives a voltage to an input pin (or pad) on the DUT;

2. a receiver or comparator that measures the voltage on an output pin (or pad) of the DUT;
3. a current load of a 50 Ohm resistive connection to a variable termination voltage and current clamps which change the 50 Ohm resistance to whatever is required to hold the current load at a fixed and programmable value;
4. memory that stores data states (drive and receive), timing, and voltage thresholds;
5. a controller that sequences the drive and receive data to and from the DUT at a programmed rate;
6. fail memory that stores information on when the expected data does not match the actual data measured by the receivers;
7. software that manages the operation of the pin electronics of the card, individually and in synchronization with other tester resources; and
8. a calibration system that measures the length of the communication connection from the pin electronics to the DUT resources on the corresponding pin on the DUT.

The pin electronics of the card 1302 can also include test hardware of an analog nature, such as analog to digital converters, digital to analog converters, and time measurement systems. The particular types of test resources of the card 1302 enable testing of the device under test ("DUT") by the tester.

Each pin electronics card 1302 includes test resources for one or more tester channels 1304, each tester channel 1304 serving to test, typically, at a single pin of the DUT. As previously mentioned, there are certain special configurations or functionalities where tester resources could drive signals from the tester to multiple pins at the same time; but most conventional testers do not have this capability and, in any event, the capability is significantly more expensive and quite limited in application. So, for purposes of discussion and understanding, the typical circumstance of test resources that drive a single pin of a single device, via a tester channel connected to the single pin of the device, is described herein. (It should be understood, however, that even if a "special capability" situation is presented, the presently disclosed embodiments will provide advantages as those skilled in the art will know and appreciate.)

Referring to FIG. 14, in conjunction with FIG. 13, another functional representation of the foregoing shows various pin electronics cards 1402, each including various respective test resources 1402*a-d*, with the separate respective tester channel 1404 connecting the applicable test resources 1402*a-d* to a single pin of a DUT (not shown in detail).

Referring to FIG. 15, conventional testers have pin electronics cards that include relays, such as the AC Relay of the exemplary pin electronics card 1500. The AC Relay, for example, electrically disconnects the test resources of the pin electronics card provided over the tester channel 1504, from a single pin of a DUT (not shown in detail) to which the tester channel 1504 is connected.

Because of the conventional design of testers and pin electronics cards, as just described, index time is consumed in testing because each tester channel can connect to only the single pin. This dictates that the tester channel for the test resources of the pin electronics card can connect for testing to solely a single pin of one DUT at each instant. In testing of each next DUT, therefore, the tester must mechanically connect the tester channel to the same equivalent single pin of the next DUT. This has required that the tester remove a DUT from the socket of the interface board of the tester after testing the DUT, and then place a next DUT in the same test socket of the interface board for performing the test on this next DUT. The tester channel, and test resources of the pin electronics card, remains unused during the mechanical displacement and replacement operations.

From the foregoing description of the conventional system and method for testing devices, it can be readily appreciated and understood that reductions of index time required in the conventional system and method would provide significant advantages. Moreover, it can be appreciated and understood that any reductions that require specialized tester and handler equipment can be inordinately expensive and limited in application.

The present invention provides these and other advantages and improvements, including improvements and nuances in the foregoing respects, without problems and disadvantages previously incurred in practice.

SUMMARY OF THE INVENTION

An embodiment of the invention is a system for testing with a tester having first and second manipulator arms. The system includes a pin electronics card of the tester, including a tester channel for connecting to a single pin of a device under test, a muxing relay connected to the tester channel, a first lead of the muxing relay, for connecting to a single pin of a first device under test, and a second lead of the muxing relay, for connecting to a single pin of a second device under test. The muxing relay electrically switches from testing of the first device under test to testing of the second device under test, and vice versa. respectively, with negligible index time.

Another embodiment of the invention is a system for testing with first and second manipulator arms. The system includes a pin electronics card, including a tester resource for connecting to a single pin of a test device, a first test socket having a first connector to a single pin of a first device under test, and a second test socket including a second connector to a single pin of a second device under test. The tester resource is selectively connectable to the single pin of the first device under test via the first test socket as the test device, and to the single pin of the second device under test via the second test socket as the test device.

Yet another embodiment of the invention is a system for testing. The system includes a first test connector, a second test connector, and a test resource connected to the first test connector and the second test connector, and selectively communicable with either the first test connector or the second test connector at any instant.

Another embodiment of the invention is a method of testing. The method includes switching a test resource between a first pin and a second pin.

Yet another embodiment of the invention is a method for testing with a tester having a first and second manipulator arm. The method includes providing a pin electronics card of the tester having a tester channel, connecting dual leads to the tester channel, and muxing between each of the dual leads.

Another embodiment of the invention is a method of testing with a tester having a first manipulator arm and a second manipulator arm. The method includes connecting a pin electronics card to a tester, wherein the pin electronics card includes: a tester channel for connecting to a single pin of a device under test, a muxing relay connected to the tester channel, a first lead of the muxing relay, for connecting to a single pin of a first device under test, a second lead of the muxing relay, for connecting to a single pin of a second device under test, and wherein the muxing relay electrically switches from testing of the first device under test to testing of the second device under test, and vice versa. respectively, with negligible index time.

A further embodiment of the invention is a method of manufacturing a pin electronics card for a tester with dual manipulators. The method includes forming a mux relay on the pin electronics card.

BRIEF DESCRIPTION OF THE DRAWINGS

The present invention is illustrated by way of example and not limitation in the accompanying figures, in which like references indicate similar elements, and in which.

DETAILED DESCRIPTION

Figure 2:
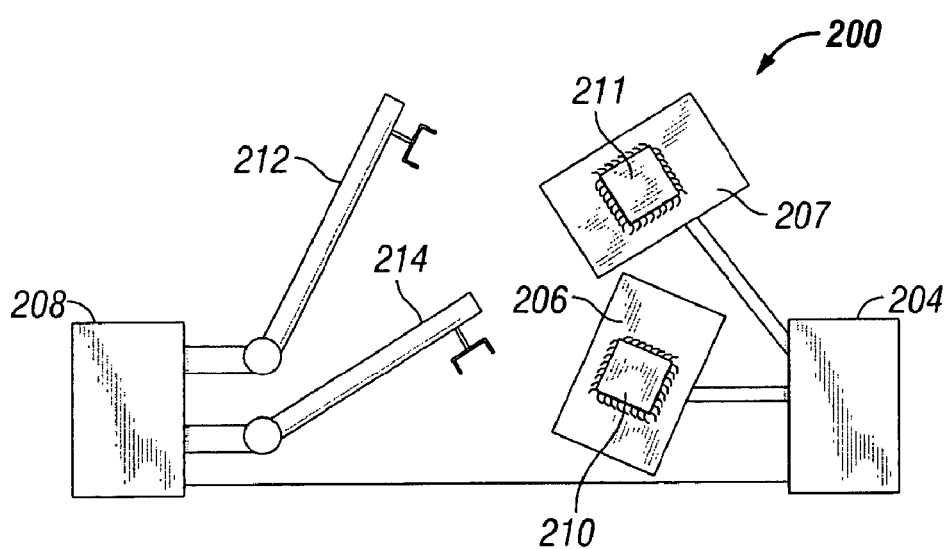
FIG. 2 illustrates a system for testing including a tester, an interface board that interconnects the tester and its test resources to the test device(s) under test, two test sockets connected in parallel to the same set of tester resources and mounted to the interface board, and an automated handler with dual manipulator arms, according to certain embodiments of the invention.

Referring to FIG. 2, a system 200 for testing a device includes a tester 204, an interface board 206 communicatively connected to the tester 204 for interconnecting the tester resources to the device under test, and a robotic handler 208. The robotic handler 208 is communicatively connected to the tester 204. The interface board 206 is communicatively connected to the tester and two or more test sockets 210 and 212. The test sockets 210 and 221 are wired in parallel, via the interface board 206 connection with the tester 204, to the tester 204 and to the tester resources of the tester 204. Because of the parallel connectivity of the test sockets 210 and 212, each socket 210, 212 is separately interfaced to the tester 204 and to the same test resources of the tester 204; however, the tester 204 can test only one or the other of the sockets 210, 212 via the same tester resources, at any instant.

Figure 1:
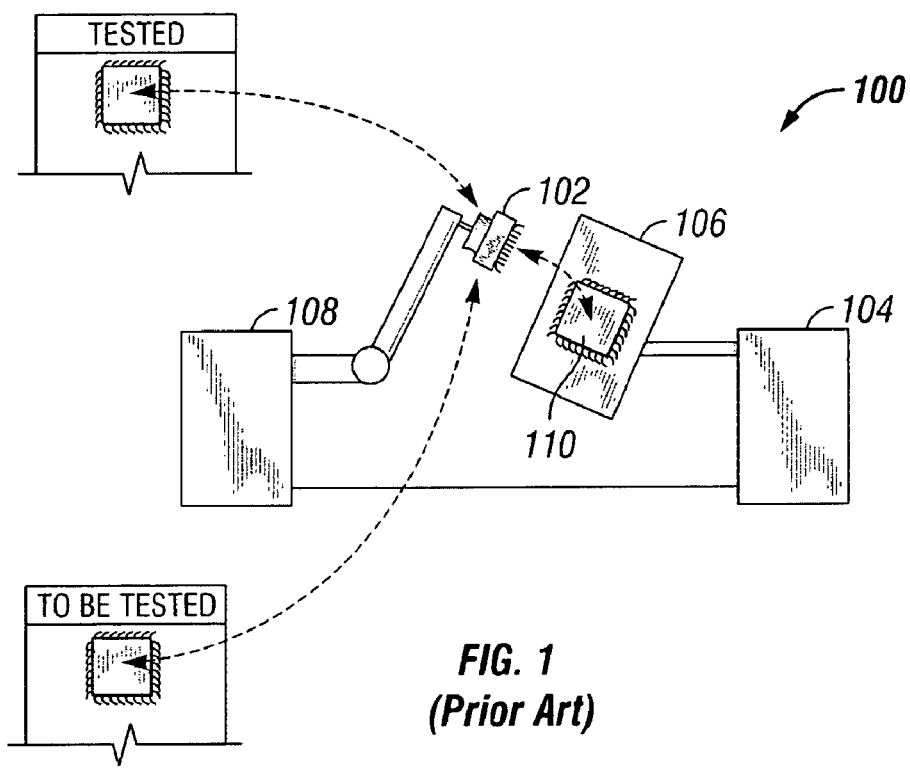
FIG. 1 illustrates a prior system for testing including a tester, an interface board that interconnects the tester resources to the device under test, one test socket on the interface board, and an automated handler with a single manipulator arm.

In the system 200, the handler 208 and the tester 204 communicate substantially as described in reference to FIG. 1 and system 100 with regards to the handler 108 and the tester 104, in that the handler 208 issues a start-of-test signal to commence testing by the tester 204 and then the tester 204 returns to the handler 208 various result data and an end-of-test signal on test completion so that the handler 208 then commences next test device mechanical placement operations. Even in a multi-site configuration (where multiple sockets are wired to different distinct test resources of a tester that permits concurrent testing via separate test resources), the same information required to identify missing devices in such a multi-site configuration are similarly communicated to the tester 204 by the handler 208. Because these communications are substantially conventional (whether the tester does or does not provide for concurrent testing via different test resources), the tester 204 in the system 200 can be any conventional tester having sequential testing capabilities for respective devices or sets of devices, such that next testing of the same tester resources can promptly commence via the tester upon completion of a preceding test of those tester resources.

The robotic handler 208 includes a first manipulator 212 and a second manipulator 214, each connected to and controlled in a coordinated and autonomous fashion by the robotic handler 208. Each of the first manipulator 212 and the second manipulator 214 is capable of handling a separate test device (or devices, if the manipulators 212, 214 have capabilities of handling more than one test device in each mechanical manipulation). When the first manipulator 212 has picked-up and positioned a first device to be tested in the socket 210 of the interface board 206, the other second manipulator 214 is concurrently retrieving a next second device to be tested. During testing of the first device in the socket 210, the second manipulator picks-up and stages the second device to be tested at socket 211.

The term "staging", used above, means that the second device handled by the manipulator 214 is not inserted into the socket 211, but is positioned mechanically close to insertion at the socket 211 without making electrical contact with the socket 211. Then, when the handler 208 receives an end-of-test signal from the tester 204, the manipulator arm 212 removes the first device from socket 210, while manipulator arm 214 simultaneously inserts the second device into the socket 211. As soon as manipulator arm 214 has fully inserted the second device into socket 211 and full electrical contact has been made between the second device and the socket 211, the handler 208 issues a next start-of-test signal to the tester 204 and testing begins on the device inserted into socket 211.

From the perspective of what is communicated to, controlled by, and tested at the tester 204, there is no difference between socket 210 and socket 211 since they are both connected to the tester 204 and its same set of tester resources. However, the tester 204 conducts testing via any particular tester resources only as to one of the sockets 210, 211 at each instant. Negligible index time results at the tester 204 in any lag period between each end-of-test signal that the tester 204 issues to the handler 208 and each next start-of-test signal issued by the handler 204 to the tester 208. Because of the parallel interfacing of the sockets 210, 211 via the interface board 206 to the tester 208, only one of the sockets 210, 211 wired to each same set of tester resources has a device inserted at any instant of time. Hereinafter, the operation of staging of each next device to be tested close to insertion in a socket, but without making electrical connection to the socket, is referred to as "pre-positioning"; and the phrase "manipulator locating a device" includes either full insertion for electrical contact or pre-positioning of a device relative to a socket.

In the system 200, when testing begins on the second device in socket 211, the first manipulator 212, as a requirement for the system 200 (and as is the arrangement with operations of any conventional tester), has already removed the first device from the socket 210, and proceeds without delay to disposition the first device just tested and then retrieve and pre-position a next untested device for testing. The mechanical motions of the manipulator 212 in retracting the already tested first device, to the pre-positioning of the next untested device, occur during the time period that the second device in the socket 211 is being tested. These mechanical motions of the manipulator (either manipulator 212 or manipulator 214) during the time period that the other manipulator (manipulator 214 or 212, respectively) maintains a next device in a socket for active testing, is herein referred to as "manipulator indexing." Manipulator indexing on manipulator 212 occurs while manipulator 214 is engaged in testing the second device in the socket 211 and also while manipulator 214 is not mechanically indexing. Likewise, manipulator indexing on manipulator 214 occurs while manipulator 212 is engaged in testing the device in the socket 210 and also while manipulator 212 is not mechanically indexing. The respective manipulator mechanical operations, and relevant manipulator indexing, is repeated for so long as either there remains additional untested devices available and waiting for test, there are no error conditions that halt operation of the system 200, or a human operator has not intervened to interrupt the sequence.

Figure 3:
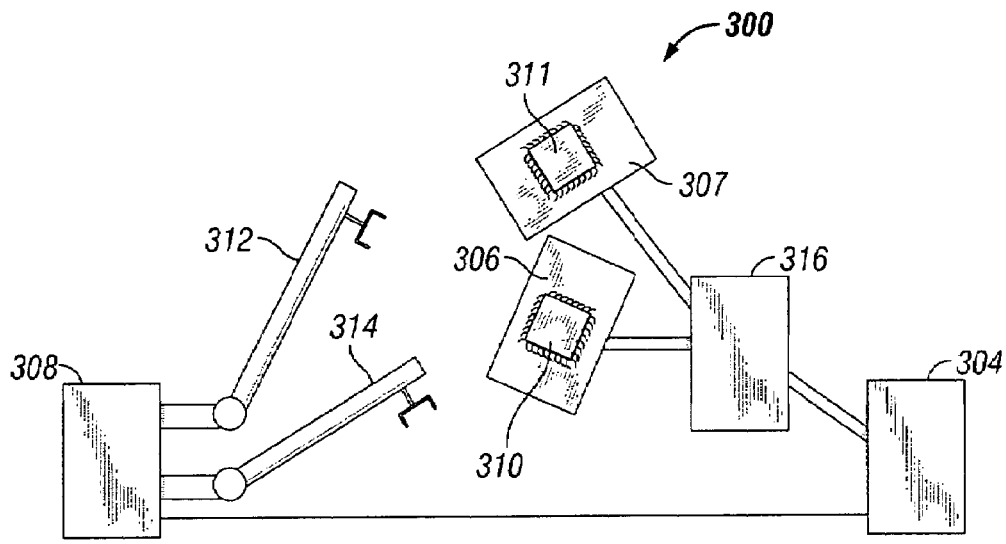
FIG. 3 illustrates a system for testing substantially like that of FIG. 2, also including a switch on the interface board that interconnects the tester and its resources to the test device(s) under test between the two test sockets on that interface board, for switching of test between those test sockets, according to certain embodiments of the invention.
Figure 4:
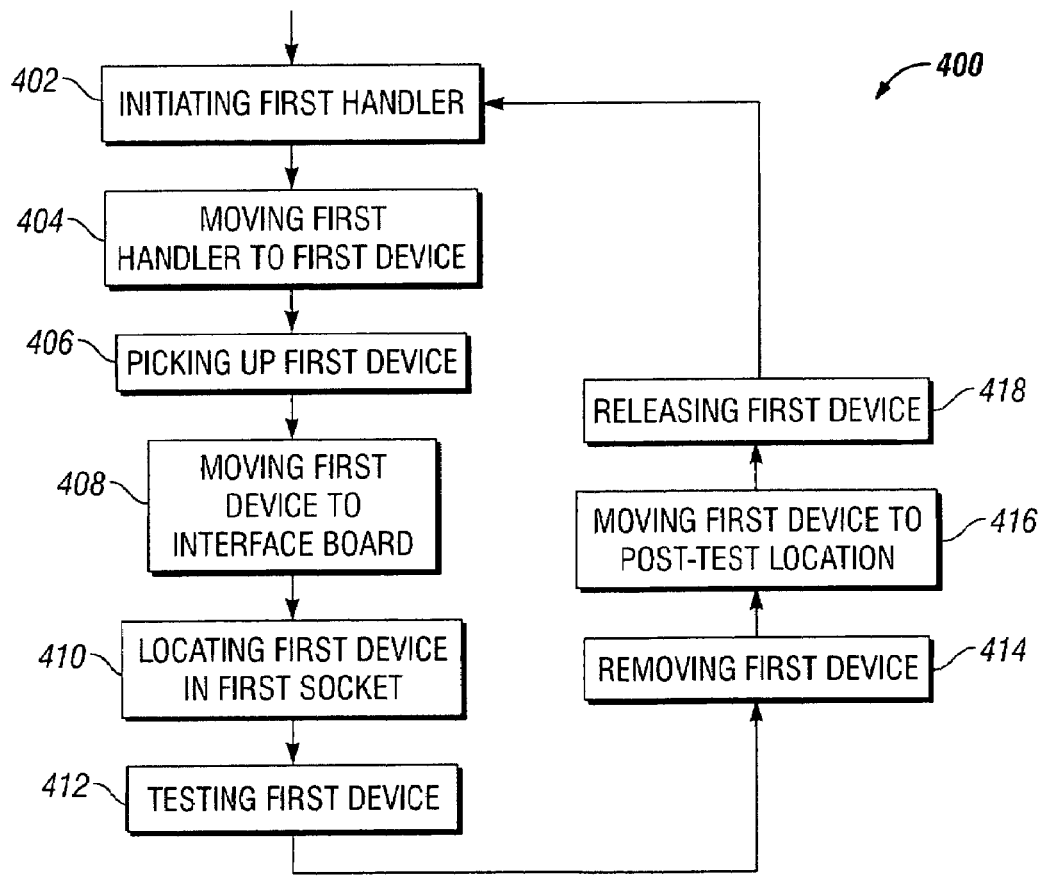
FIG. 4 illustrates a prior method for testing including index time required for a manipulator arm to move and replace each next successive test device for testing, such that testing of successive devices is interrupted and idle during periods of operation of the manipulator arm in moving and replacing each successive test device.

Referring to FIG. 3, a system 300 for testing a device 302 includes a tester 304, a robotic handler 308 having a first manipulator 312 and a second manipulator 311, an interface board 306 having a first socket 310 and a second socket 311, and a relay 316. The handler 308 is communicatively connected to the tester 304 and also communicatively connected to the relay 316 via the interface board 306. The interface board 306 is communicatively connected to the tester 304, the handler 308, the relay 316, and the sockets 310 and 311. The first socket 310 and the second socket 311 are communicatively connected to the tester 304 in parallel via the relay 316, such that the tester 304 is selectively switched in communicative connection, between testing at the socket 310 or the socket 311.

The relay 316 includes switch elements (not shown in detail) to switch testing connectivity between, respectively, the first socket 310 and the second socket 311. The relay 316 is not needed in low frequency testing (as shown in FIG. 2) because splitting of signals from the tester 304 to the first and second sockets 310, 311 will not result in asymmetries that cause significant timing and impedance problems. A rule of trace length matching in the design of the interface board 306 and interface board 206 (as shown in FIG. 2) should always be practiced since most semiconductor test systems use TDR (Time Domain Reflectometry) to calibrate out propagation delay among all signal connections between the tester and all interface pins on a device under test. Unequal trace length matching for a split signal, even when switched by relays as in system 300, will confuse a TDR system and result in erroneous calibration data and invalid test results. Additionally and to the extent possible, the transmission line impedance profile required by a given TDR system should be observed in the design of any test cell interface hardware.

Where higher frequency testing is conducted, however, splitting of signals from the tester 304 to the sockets 310, 311 can result in asymmetries such that timing and impedance problems can be significant. In such situations of higher frequency testing, therefore, the system 300 (of FIG. 3) switches the test signals between test socket 310, on the one hand, and the test socket 311, on the other hand, as applicable, to prevent impedance asymmetries of the test signals in respective testing at the sockets 310 and 311 at different time intervals. Observing a rule of trace length matching in the design of the interface board 306 allows TDR to be executed on system 300 as normal and without error.

In the system 300, the handler 308 and the tester 304 communicate substantially as described in reference to FIG. 1 and system 100 with regards to the handler 108 and the tester 104, in that the handler 308 issues a start-of-test signal to commence testing by the tester 304 and then the tester 304 returns to the handler 308 various results data and an end-of-test signal on test completion so that the handler 308 then commences next test device mechanical placement operations—i.e., the manipulator locating a next device for testing.

Further in the system 300, the communicative connection between the handler 308 and the relay 316, via the interface board 306, provides the handler 308 with conventional signals and communications with the tester 302 for appropriate handler 308 operations. The handler 308, itself, detects (or "knows") which of either socket 310 or socket 311 has therein located a next device waiting for test. The handler 308, therefore, can control the relay 316 switching to switch the tester 302 and tester resources between the first socket 310 or the second socket 311, according to the socket 310 or 311 holding the next device for test. An algorithm for relay 316 control is integrated into the same program of the handler 308 that controls the manipulators 311, 312. Particularly, once an end-of-test signal issues from the tester 304 to the handler 308, the handler 308 sends a control signal to the relay 316 and switches it according to the next ready test device in the socket 310 or 311 as detected by the handler 308. The tester 304 operations effectively need not be altered, because the tester 304 merely continues testing of the next device and treats each socket 310, 311 individually as a single socket connected to the same set of tester resources for purposes of tester 304 operations.

The tester does not detect and has no indicator (i.e., is not "aware") that there are two different physical socket locations (sockets 310 and socket 311). The tester 308, therefore, does not and need not have the information required to control the switching of the relay 316. Because the handler 308 has information applicable to control of the switching of the relay 316, the handler 308 can serve to switch the relay 316.

Alternatively, though, if the tester 304 must control the relay 316 (as may be applicable in certain applications or in alternative embodiments herein), a test program executing on the tester 308 must query the handler 308, receive the switching data, process the data into information in order to make a decision about switching and test device location among the sockets, and then send a control signal to the relay. This alternative requires code modification, recompilation, code testing, correlation, and release. It is expected that such variation of tester 308 control of switching would additionally add cost to the handler 308 design, since the handler 308 would be required to have an updated command set in the handler 308 system software. This work is both expensive and time consuming, but can be implemented with cost as an alternative arrangement for control of switching of the relay 316 and successive respective testing of devices in multiple sockets.

In operation of the system 300, the first socket 310 communicatively connects to the tester 304 through the relay 316, for testing of a device placed in the first socket 310. Then, the relay 316 causes the first socket 310 to be communicatively disconnected from the tester 304, and the second socket 311 communicatively connects to the tester 304 through the relay 316. In this manner, a device in the first socket 310 is tested by the tester 308, immediately followed by testing of another device in the second socket 311. The first manipulator 312 manipulates the device for the first socket 310 into and out of the first socket 310 during times of testing the other device in the second socket 311, and vice versa. The system 300, thus, eliminates idle time of the tester 308 which is otherwise experienced when the first manipulator 312 and the second manipulator 311 are respectively mechanically operating to pick-up, position on the socket, and remove devices in testing operations.

Figure 5:
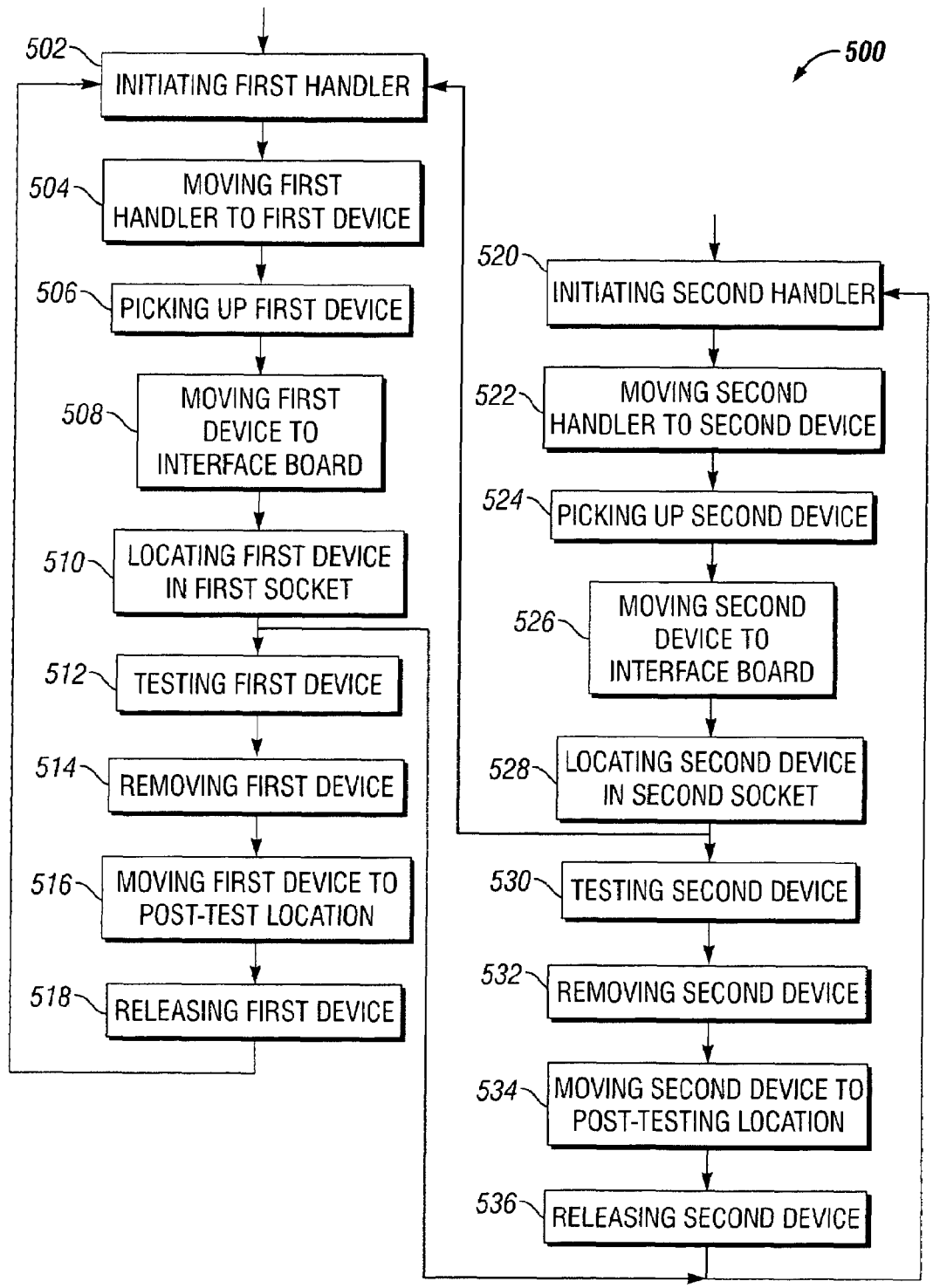
FIG. 5 illustrates a method for testing including negligible index time required, wherein a pair of test sockets and two manipulator arms effect immediate successive testing of devices at each of the test sockets on the interface board, the sockets are wired in parallel to the same set of tester resources on the interface board that interconnects the same set of tester resources to the devices under test, and the negligible index time is achieved by moving and replacing a device in one test socket while testing is being performed in the other test socket, and vice versa, according to certain embodiments of the invention.

Referring to FIG. 5, a method 500 operates in the system 200 of FIG. 2 or the system 300 of FIG. 3. In the method 500, a first manipulator is initiated in a step 502 to commence retrieval of a first test device for testing in a first socket of an interface board connected to a tester. The tester in the method 500 is also connected to a second socket, but in parallel communicative connectivity with the first socket. The method 500 can include relay of signals of the tester, such as occurs in the system 300 of FIG. 3 in a high frequency testing environment; or, alternatively, the signals of the tester can be split so that there is no relay of test socket testing signals. The same method 500 applies to operations of the manipulators for testing, notwithstanding whether or not any relay is present.

In a step 504, the first manipulator then moves to the first device for testing. The first manipulator picks-up the first device in the step 506. The first manipulator moves the first device to the first interface board in a step 508, and inserts the first device into the first socket of the first interface board in a step 510.

Thereafter, the tester commences testing the first device via the first socket, in a step 512.

Once the first device is located in the first interface board in the step 510 and as the step 512 of testing the first device commences, the second manipulator is initiated in a step 520. In a step 522, the second manipulator moves to a second device. The second manipulator picks-up the second device in a step 524, and moves the second device to the second interface board in a step 526. In a step 528, the second manipulator inserts the second device into the second socket of the interface board (either at the same time testing of the first device is occurring in the configuration of the system with the relay; or otherwise, immediately upon removal of the first device from the first socket after testing of the first device and insertion into the second socket of the second device is completed if there is not any relay).

Upon completion of testing the first device, the first manipulator in a step 514 removes the first device from the first socket in the first interface board. Promptly upon completion of testing the first device, the tester commences testing of the second device in a step 530. If the testing environment involves high frequency signals of the tester, the relay (of FIG. 3) switches the test signals of the tester from the first socket to the second socket, in order to begin the test of the second device. As previously mentioned, in low frequency testing, the relay is not necessary and test signals of the tester can be split between the first socket and device therein, and the second socket and device therein, without asymmetry concerns of timing and impedance problems. In either event, the testing of the first device concludes and the testing of the second device immediately commences. Thus, there is virtually no idle time of the tester and the index time in the method 500 is minimal.

During testing of the second device in the step 530, the first manipulator removes the first device from the first socket in the step 514. The first manipulator thereafter moves the first device in a step 516, such as to a post-test location for the devices being tested. In a step 518, the first manipulator releases the first device. Responsive to a signal indication from the handler that a next device is waiting to be picked-up by the first manipulator for testing in the step 512, the first manipulator is again initiated in the step 502. The method 500 then continues with respect to the first manipulator again through the steps of the method 500.

When testing of the second device is completed in the step 530, the method 500 as to the first manipulator has located a next successive test device in the first socket pursuant to the step 510 (either upon test completion and removal of the second device from the second socket and insertion of the next successive device in the first socket if no relay in the system; or otherwise, upon switching of tester resources to the first socket upon completion of the testing of the second socket where the system includes the relay). Thus, immediate testing of this next successive device commences via the step 512.

During the testing of the next successive device, the method 500 continues with respect to the second manipulator in the step 532 of removing the second device from the second interface board. Next, in a step 534, the second manipulator moves the second device to a post-test location. In a step 536, the second device is released by the second manipulator at the location.

The method 500 continues with respect to the second manipulator, during the testing at the first socket in the step 512, by again initiating the second manipulator in the step 520. As testing at the first interface board proceeds in the step 512, the second manipulator proceeds through steps 522, 524, 526 and 528 of the method 500. Once testing at the first interface board is completed, the second manipulator has, via the method 500, located a next successive test device in the second interface board and testing of the device proceeds in the step 530.

Of course, during the testing of the second device, the method 500 continues with respect to the first manipulator through the steps 514, 516, 518 and back to 502 of the method 500. In this manner, the tester is virtually continuously performing successive testing of respective devices in the successive steps 512, 530. While testing is proceeding in step 512, the second manipulator moves through the steps 532, 534, 536, and again to 520 and on, of the method 500. Likewise, while testing next proceeds in step 530, the first manipulator moves through the steps 514, 516, 518, and back to steps 502, 504, 506, 508 and 510 of the method 500. The method 500 proceeds continuously in this manner, until interrupted (for example, manually by a test supervisor, automatically because of default, or otherwise), or otherwise until all devices for testing are tested and handled in the method 500.

With the foregoing systems 200, 300 (of FIGS. 2 and 3) and method 500 (of FIG. 5), various alternatives and additions are possible. Particularly, certain conventional interface boards may have several test sockets or cells for simultaneous testing of multiple devices via a tester. In such instances, the robotic handler can have manipulators that simultaneously manipulate, move and place multiple testing devices in the interface board in a single pass. The systems 200, 300 will similarly include dual interface boards in parallel connection with the tester (or, if applicable, sets of parallel-connected sockets and/or interface boards), however, each interface board will have several sockets for simultaneous placement and testing of devices on each respective board. The method 500 will, nonetheless, proceed similarly, with the exception that multiple devices will simultaneously be handled by the respective manipulators.

In other alternatives, multiple manipulators beyond two, and multiple interface boards beyond two, can be employed. In such instances, each interface board can, likewise, have multiple testing sockets for simultaneous testing at each board of multiple devices. The interface boards can be communicatively connected in parallel to the tester, and any necessary relay can serve to switch test signals as required.

Moreover, testing systems in accordance with the systems 200, 300, and test steps and processes in accordance with the method 500, can be employed in a wide variety of manufacturing and testing operations. For example, semiconductor devices are only one type of devices suitably tested with the systems and methods. Other devices can include optical devices, with appropriate optical testing boards, relay, and tester; mechanical devices, with appropriate mechanical and physical test cells and tester; and any of a wide variety of other possibilities. In each such possibility, parallel connected interfaces to the tester, coupled with multi-manipulator operations, can reduce and eliminate index times in the test process.

In view of the foregoing, and without limiting the scope of the description herein, a detail of an example semiconductor test arrangement is given.

Figure 6:
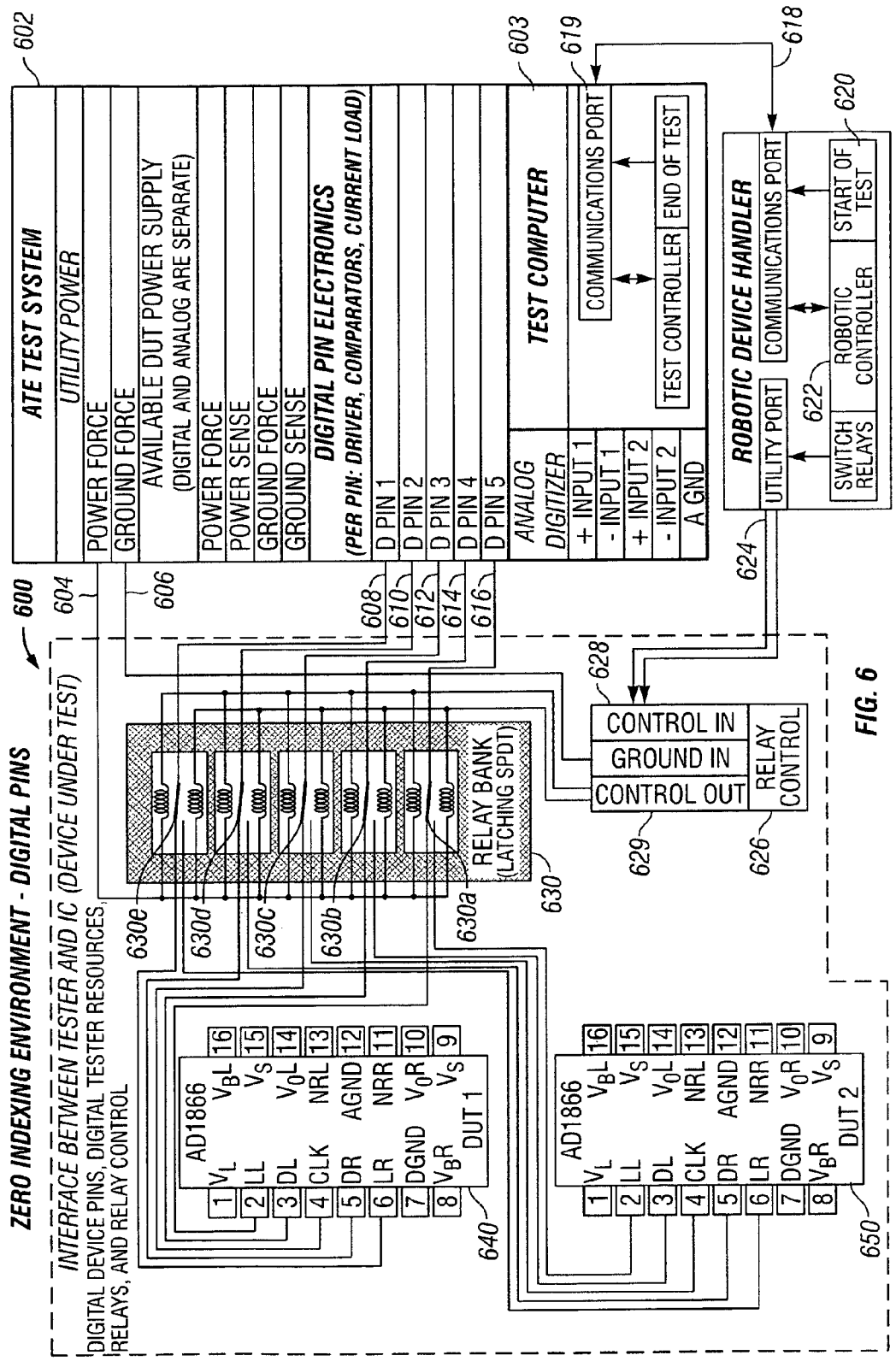
FIG. 6 illustrates a system for testing digital pins of devices according to the method of FIG. 5, wherein index time is negligible, including a switch on the interface board that selects between each of a pair of test sockets wired in parallel to the same set of tester resources, and two manipulator arms for manipulating devices for testing in one test socket while testing is performed in the other test socket, and vice versa, according to certain embodiments of the invention.

1. Semiconductor Automated Test Equipment (ATE)—Example Embodiment:

Referring to FIG. 6, a digital device testing system 600 can be used for testing a semiconductor chip or the like. The system 600 includes a conventional automated test equipment (ATE) 602. The ATE 602 is driven by a power supply (not shown) and includes a test computer 603 for controlling and performing applicable tests via the ATE 602. The ATE 602 has connector ports for power 604, ground 606, and digital pin electronics 608, 610, 612, 614, 616. The ATE 602 is communicatively connected, via a connector 618 at a communications port 619 of the ATE 602, to a robotic device manipulator 630 having dual manipulator arms. The robotic device handler 620 includes a robotic controller 622 for receiving and processing signals and test information from the ATE 602, via the connector 618.

A utility port 624 of the device handler 620 connects to a relay control 626 at a control port 628 thereof. The relay control 626 also connects to the ground 606 port of the ATE 602. Output control signals are connected to a relay bank 630, from a port 629 of the relay control 626.

The relay bank 630 includes a series of relay switches 630a through 630e, for example. Details of the relay bank 630 and relay control 626 are more particularly later described in connection with FIG. 7 herein. For purposes of discussion in connection with FIG. 6, each relay switch 630a though 630e is connected to respective and corresponding digital pins of a first device under test (DUT1) 640 and a second device under test (DUT2) 650. In FIG. 6, the switches 630a through 630e are set to communicate test signals to the DUT1 640. As previously described with respect to the method 500 in FIG. 5, both the DUT1 640 and the DUT2 650 are connected via respective interface boards (not shown in FIG. 6) to the relay bank 630. In this manner, after testing of the DUT1 640 is completed, the relay control 626 effects switching of the switches 630a through 630e of the relay bank 630, in order to next test the DUT2 650.

The relay control 626 selects switching of the switches 630a through 630e of the relay bank 630, based on control signal from the robotic device manipulator 624. The robotic device manipulator 624 communicates with (by exchange of signals back and forth) the test computer 603 of the ATE 602, for example, when testing of a device is completed. In the example, the robotic device manipulator 624 initiates the test process of the ATE 602 upon completing placement of the DUT1 640 in the interface board connected through the relay bank 630 to the ATE 602. The ATE 602 then conducts testing, according to the testing protocols programmed and controlled by the test computer 603 of the ATE 602.

Upon completion of the testing of the DUT1 640 by the ATE 602, the ATE 602 signals the robotic device handler 620 of the test completion, for example, by communicating test results for the DUT1 640 to the handler 620. The handler 620 then controls the manipulator arms as appropriate to remove the DUT1 640 from its socket on the interface board connected through to the ATE 602. Upon receiving the end of test signal from the ATE 602, the handler 620 signals to the relay control 626 and the relay control 626 flips the switches 630a through 630e of the relay bank 630 to communicatively connect the DUT2 650 through the relay bank 630 to the ATE 602. The handler 620 then issues the next start-of-test signal to the ATE 602, and the ATE 602 then commences testing of the DUT2 650.

As described in connection with the method 500 in FIG. 5, the robotic device handler 620 manipulates one of its manipulator arms to remove and move the already tested device and to retrieve and place a new device for testing, each time a device is tested. This operation of the device handler 620, coordinated with the relay bank 630 and ATE 602, ensures that the ATE 602 is substantially continuously testing a device while the other device is being removed and replaced.

Figure 7:
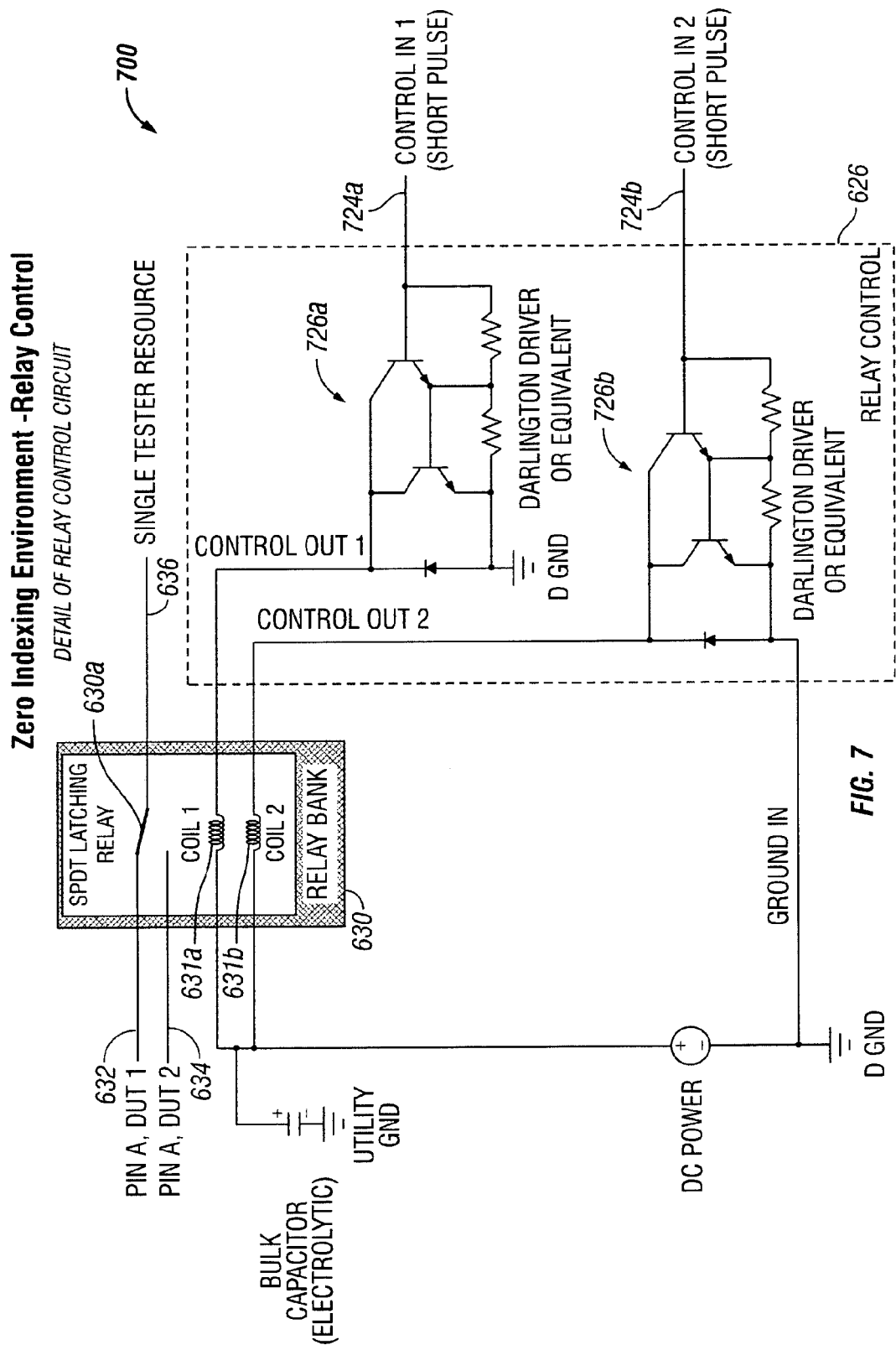
FIG. 7 illustrates an electrical circuit and hardware components for use in the system of FIG. 6, for controlling the switching of electrical connections between each test socket of a pair of test sockets on an interface board, wherein the switch selects between one of the pair of test sockets wired in parallel to the same set of tester resources and constrains the operation so that only one socket of the pair is connected to the tester at any given instant in time, and the switch provides electrical isolation from the tester for one of the test sockets, while the other socket is electrically connected to the tester and available for use in testing, and vice versa, according to certain embodiments of the invention.

Referring to FIG. 7, a relay 700, like that described in connection with FIG. 6, includes a relay control 626 and a relay bank 630. For purposes of the illustration in FIG. 7 and description of the relay 700, the relay control 626 and the relay bank 630 each provide for only a single switch 630a. The switch 630a operates between two possible connections, a connector 632 to PinA, DUT1, or a connector 634 to PinA, DUT2. The switch 630a effects communicative connection of either such connector 632, 634 to a single test signal 636 from the tester (not shown in FIG. 7). As is typical in the relay 700, relevant signals input as 724a, 724b from the robotic device manipulator (not shown in FIG. 7) cause the switch 630a to connect through the signal 636 through the switch 630a to either the connector 632 or 634, as desired for testing of the respective DUT1 or DUT2.

The relay control 626 has inputs of a first control signal 724a and a second control signal 724b, from the utility port 624 (not shown in FIG. 7) of the robotic device handler 620 of FIG. 6. Each control signal 724a, 724b connects to respective "Darlington Drivers" or equivalent power transistor drivers 726a, 726b. These drivers 726a, 726b are available, for example, from NTE Electronics, Inc. part number NTE215 Silicon NPN Transistor Darlington Driver. The respective drivers 726a, 726b connect to ground and also to a relay bank 730.

The relay bank 730 shown in FIG. 7 is substantially simplified from that used in the system 600 of FIG. 6, wherein multiple pins of each device under test (i.e., DUT1 and DUT2) are concurrently connected to the tester 602 through the relay bank 630. Nonetheless, the relay bank 630 of FIG. 7 illustrates a single switch 630a of the corresponding relay bank 630 in FIG. 6. The switch 630a is disposed at the relay bank 630 between coils 631a, 631b. The coils 631a, 631b are respectively driven by the outputs of the respective transistor drivers 726a, 726b of the relay control 626. The relay control 626, in this manner, switches the switch 630a in order to selectively communicatively connect either Pin A, DUT1 632 or Pin A, DUT2 634 for testing via the test signal 636 at each test instance.

In general in the embodiments, complete testing protocols will be performed on a first test device, then the relay control 626 will cause switching to a second device for testing, and thereafter repeated. During testing of any device, the next device for testing is being retrieved and located in the interface board for next testing. Then, upon completion of a test on a device, the relay control 626 switches the relay bank 630 to the next successive device for testing, and testing of each next successive device immediately commences and continues in this manner without any significant index time delays.

Figure 8:
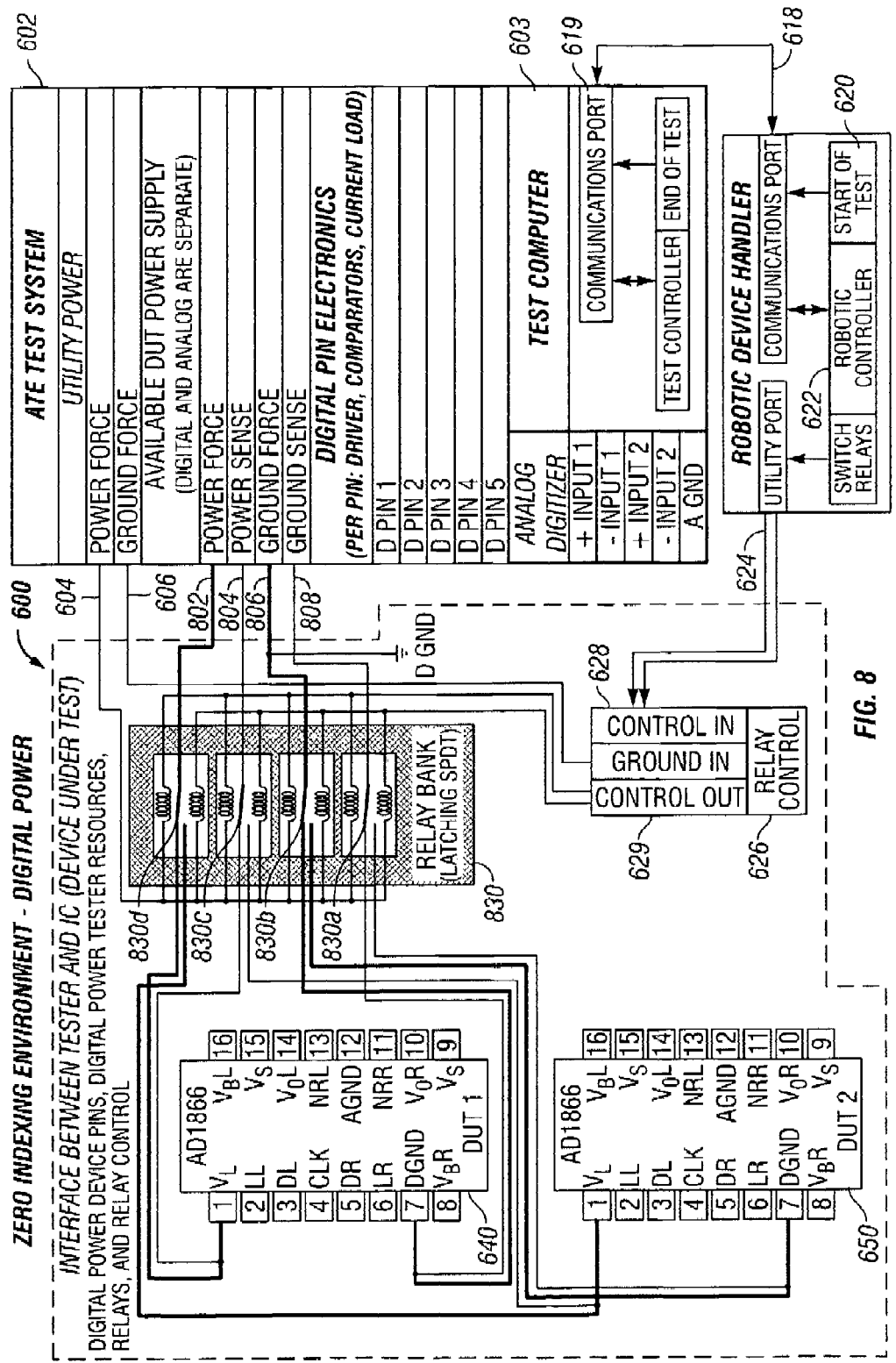
FIG. 8 illustrates a system, substantially like that of FIG. 6, for testing digital power of test devices according to the method of FIG. 5, according to certain embodiments of the invention.

Referring to FIG. 8, the system 600 of FIG. 6 is illustrated showing connections for digital power of devices in testing. Particularly, the system 600 includes the ATE 602, the robotic device handler 620, the relay control 626, and a relay bank 830 connected across switches 830a through 830d between power connectors 802, 804 and ground connectors 806, 808 and respective digital power pins of each of the DUT1 640 and the DUT2 650. As with the system 600 of FIG. 6, the system 600 in FIG. 7 serves to provide substantially continuous sequential power testing of the DUT1 640, followed by the DUT2 650, with robotic manipulator handling and replacement of each respective DUT while the other DUT is communicatively connected by the switches 830a through 830d of the relay bank 830 to the tester 602 for testing.

Figure 9:
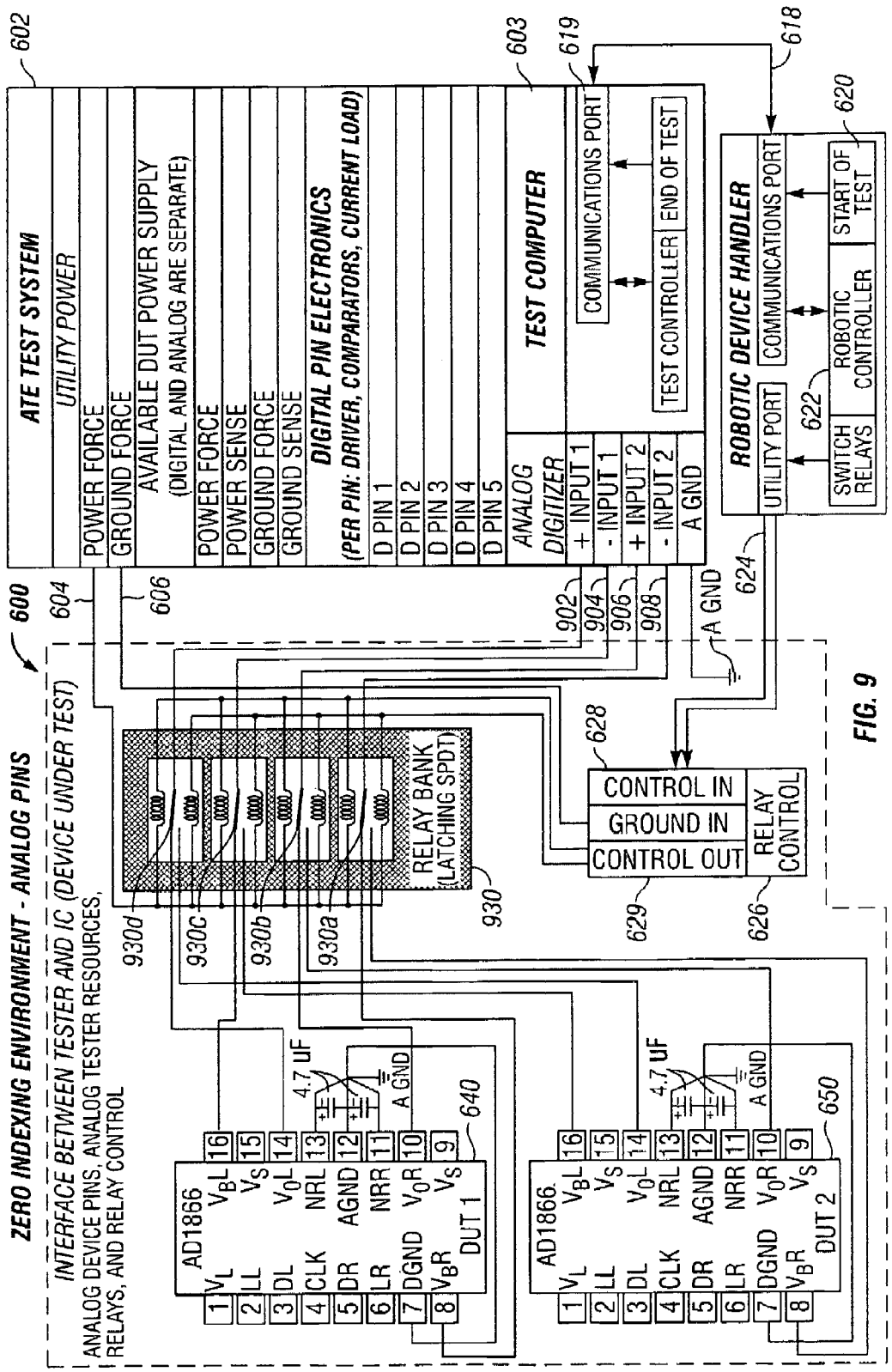
FIG. 9 illustrates a system, substantially like that of FIGS. 6 and 8, for testing analog pins of test devices according to the method of FIG. 5, according to certain embodiments of the invention.

Referring to FIG. 9, the system 600 of FIGS. 6 and 8 is illustrated showing connections for analog pin testing of respective devices, DUT1 640 and DUT2 650. In the system 600 of FIG. 9, the ATE 602 connects at analog digitizer connections 902, 904, 906, 908 to the respective switches 930d, 930c, 930b, 930a of the relay bank 930. Each of the switches 930a, 930b, 930c, 930d connects to the respective DUT1 640 and DUT2 650 at analog pins thereof. As with the system 600 of the prior illustrations, the switches 930a, 930b, 930c, 930d are controlled by the relay control 626, via the manipulator 630, in order to respectively communicatively connect the tester 602 for testing of each respective DUT1 640 and DUT2 650, in virtually uninterrupted succession. While one of the DUT's is being tested, the other DUT is being moved and replaced by the handler 620 with a next device for testing.

Figure 10:
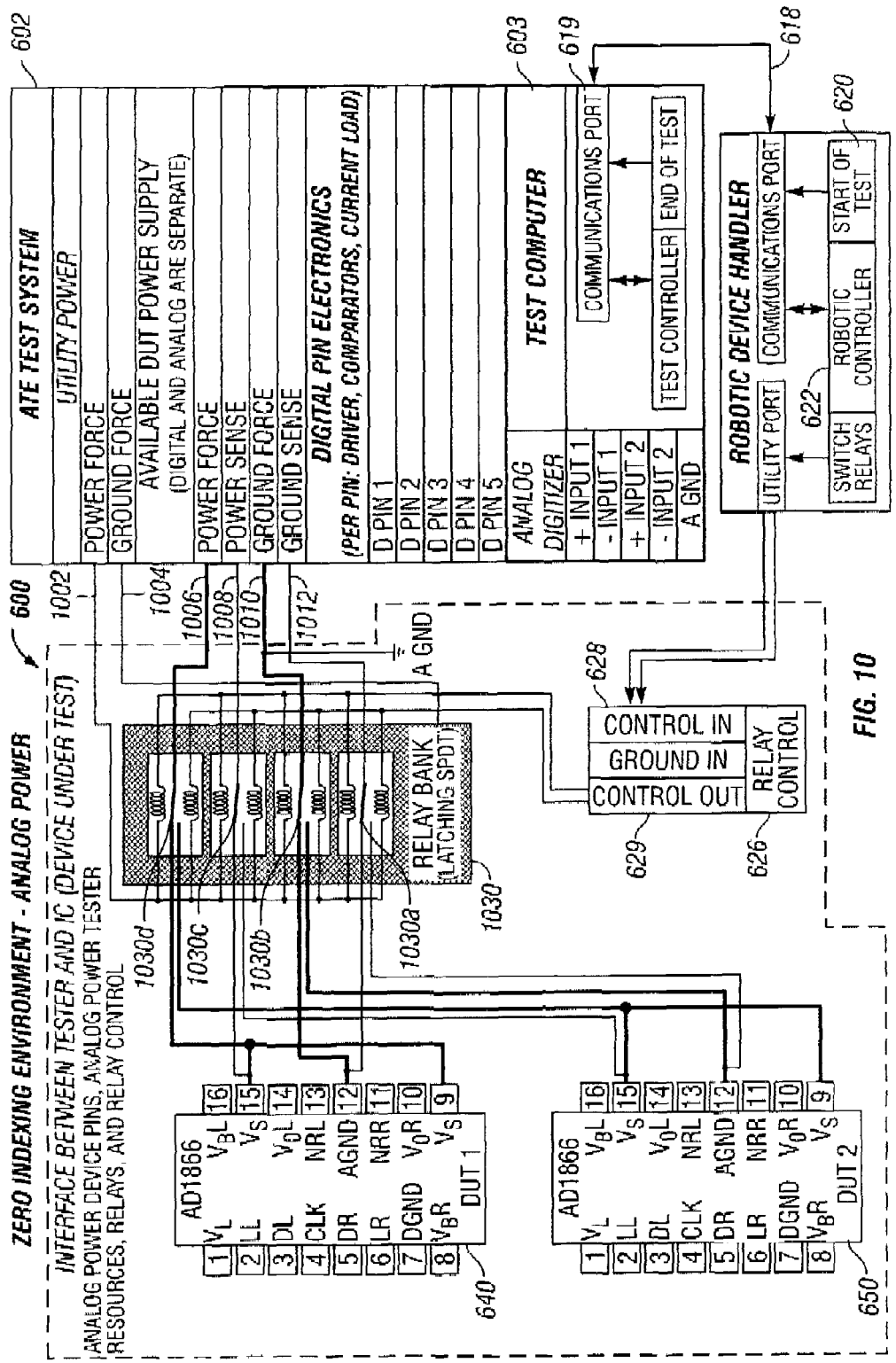
FIG. 10 illustrates a system, substantially like that of FIGS. 6, 8 and 9, for testing analog power of test devices according to the method of FIG. 5, according to certain embodiments of the invention.

Referring to FIG. 10, the system 600 of FIGS. 6, 8 and 9 is illustrated showing connections for analog power testing of respective devices, DUT1 640 and DUT2 650. In the system 600 of FIG. 10, the ATE 602 connects at utility power connections 1002, 1004 across the coils of the relay bank 1030 with the relay control 626. The switches 1030d, 1030c, 1030b, 1030a are connected to DUT power connections 1006, 1008, 1010, 1012 of the tester 602. Similarly to the prior discussion, the respective switches 1030d, 1030c, 1030b, 1030a of the relay bank 1030 each selectively communicatively connect the tester 602 to each of the respective DUT1 640 and DUT2 650 at analog power pins thereof. The switches 1030a, 1030b, 1030c, 1030d are controlled by the relay control 626, via the manipulator 630, in order to respectively communicatively connect the tester 602 for testing of each respective DUT1 640 and DUT2 650, in virtually uninterrupted succession. While one of the DUT's is being tested, the other DUT is being moved and replaced by the handler 620 with a next device for testing.

Referring to FIGS. 6 through 10, in conjunction, it is illustrated and can be understood that multiple ones of the relay banks 630, 830, 930, 1030 can be employed at the same time in the system 600, in order to perform testing of respective ones of the DUT1 640 and DUT2 650 in immediate succession. During testing of one of the DUT's, the handler 620 moves and replaces the other DUT. In such arrangement, the relay control 626 controls switching of each of the relay banks 630, 830, 930, 1030 in order that each DUT may be successively tested as the DUT1 640 and DUT2 650. Because the handler 620 changes a DUT with a new device for testing, during the testing of the other DUT, the index time for the system 600 is negligible and testing of successive devices is substantially continuous by the tester 602.

Figure 11:
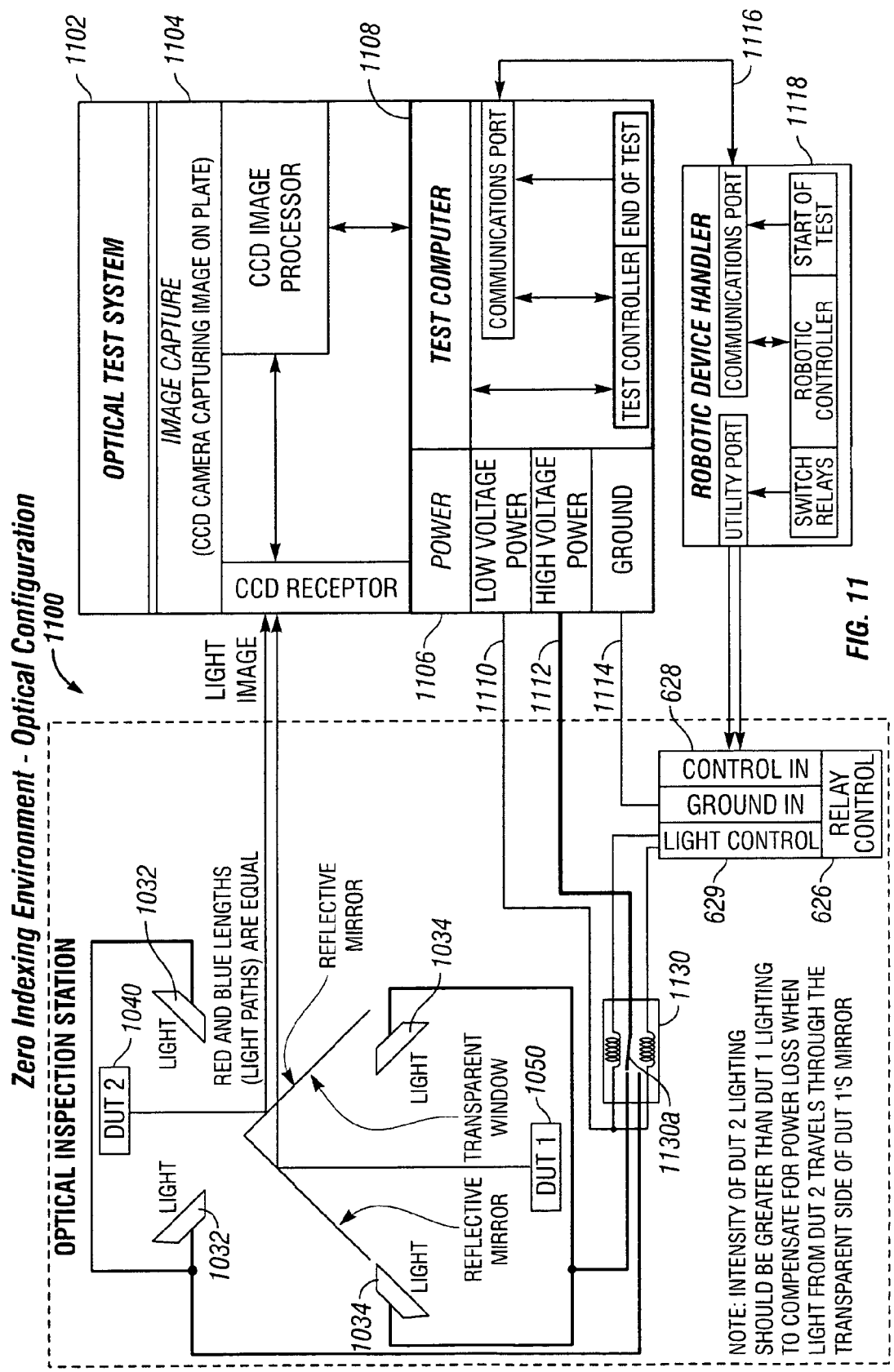
FIG. 11 illustrates a system for testing optical devices, substantially in accordance with the concepts of FIGS. 5, 6, 8, 9 and 10, according to certain embodiments of the invention.

2. Optical Device Automated Test Equipment (ATE)—Example Embodiment:

Referring to FIG. 11, another test system 1100 for testing optical devices employs similar relay elements in order to perform continuous successive testing by a tester 1102. The tester 1102 includes an image capturer 1104, having a CCD receptor and a CCD image processor. The image capturer 1104 is connected to a test computer 1108 of the tester 1102. The tester 1102 also includes a power source 1106 and connections 1110, 1112, 1114 therefrom.

The test computer 1108 of the tester 1102 communicatively connects, via a connector 1116, to a robotic manipulator 1118. The robotic manipulator 1118 is substantially as has been previously described, including the manipulator 1118 has dual manipulator arms and receives test information and controls testing of respective dual devices, a DUT1 1050 and DUT2 1040, via connections to a relay control 626, as previously detailed. The relay control 626 controls switching of a switch 1130a of a relay 1130. The switching effects communicative connections, across the relay 1130, between the tester 1102 and respective test capture elements 1032, 1034 for the corresponding DUT1 1032 and DUT2 1034, respectively. As with the prior descriptions of the system 600 (of FIGS. 6, 8, 9 and 10), the system 1100 switches testing between the DUT1 1040 and the DUT2 1050, in immediate succession. During testing of one of the DUT's, the other DUT is moved and replaced by the manipulator 1118 with a next device for testing. In this manner, the tester 1102 substantially continues testing operations with each successive next device, with negligible idle index time.

Figure 12:
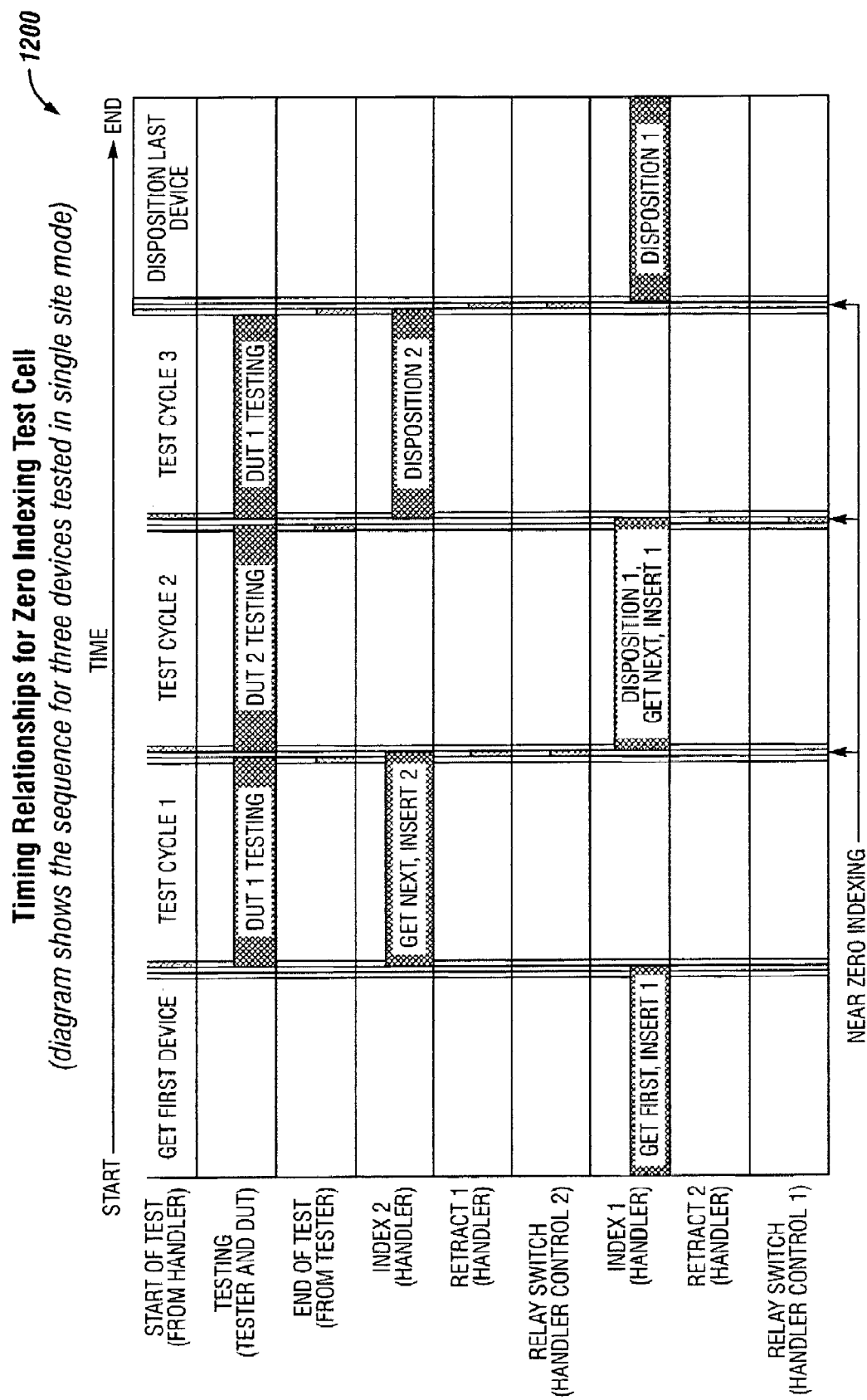
FIG. 12 illustrates timing relationships in test cycles of the method of FIG. 5 and the systems of FIGS. 6, 8, 9, 10 and 11, wherein negligible index time is required, according to certain embodiments of the invention.
Figure 13:
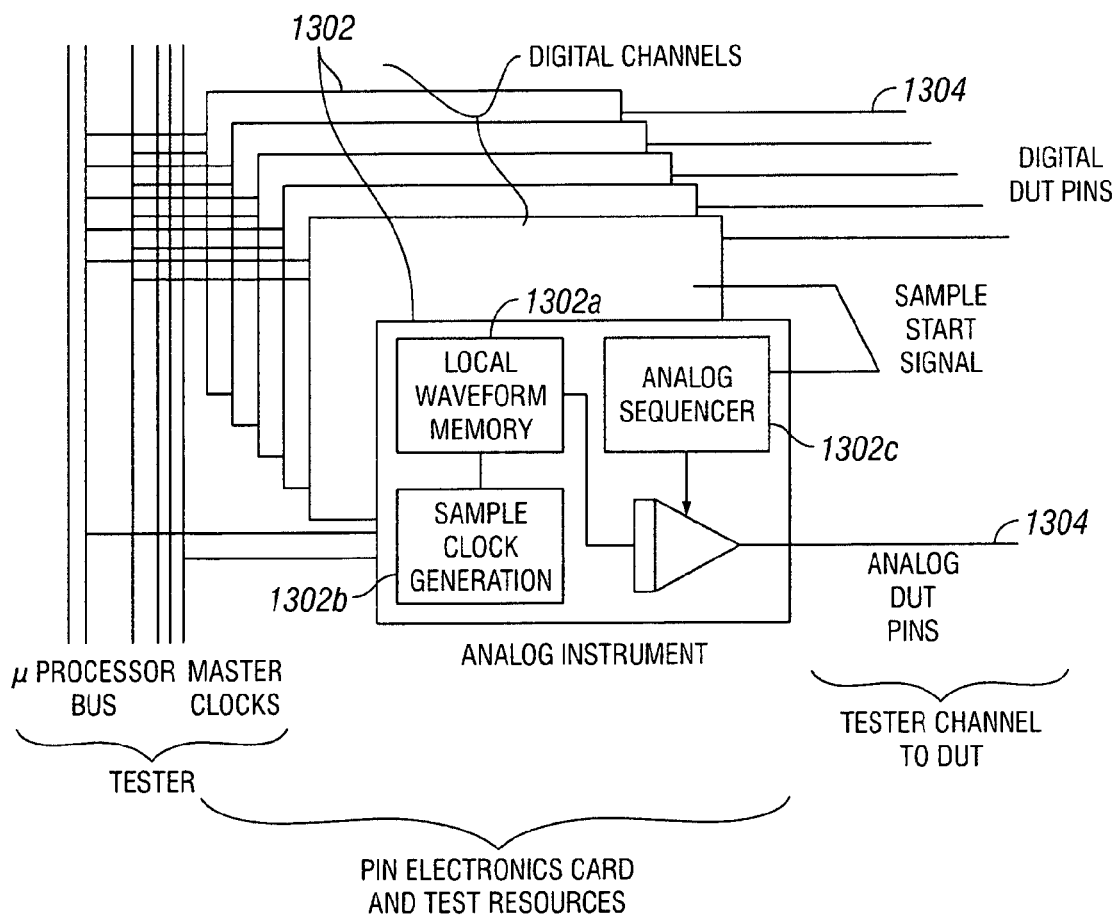
FIG. 13 illustrates a simplified functional example of a pin electronics card of a conventional tester, the pin electronics card including a set of test resources, and the test resources being connectable by a tester channel for the particular resources, to a single pin of a device under test, according to certain embodiments of the invention.
Figure 14:
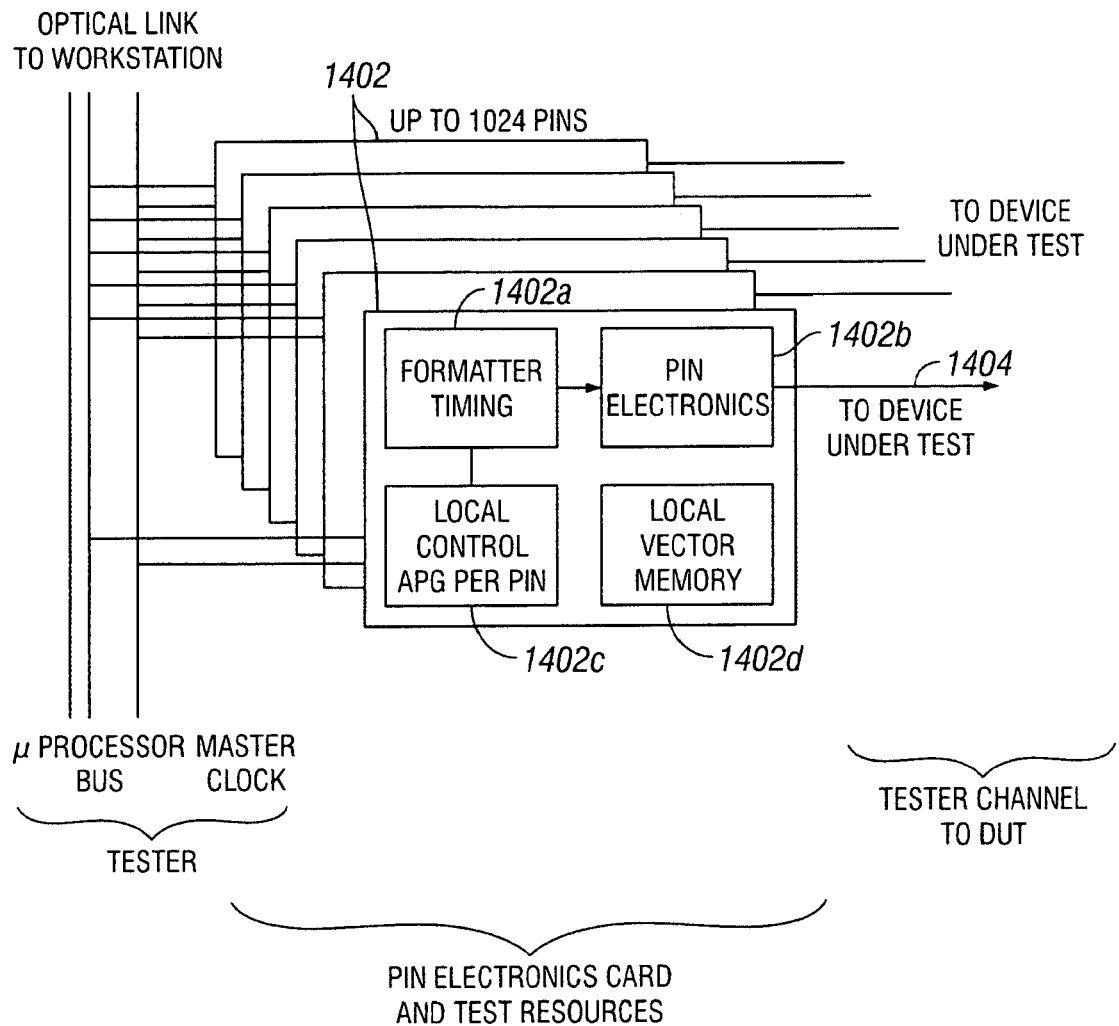
FIG. 14 illustrates another example of a pin electronics of a conventional tester, also including test resources, and the test resources being connected by a tester channel to a single pin of a device under test, according to certain embodiments of the invention.
Figure 15:
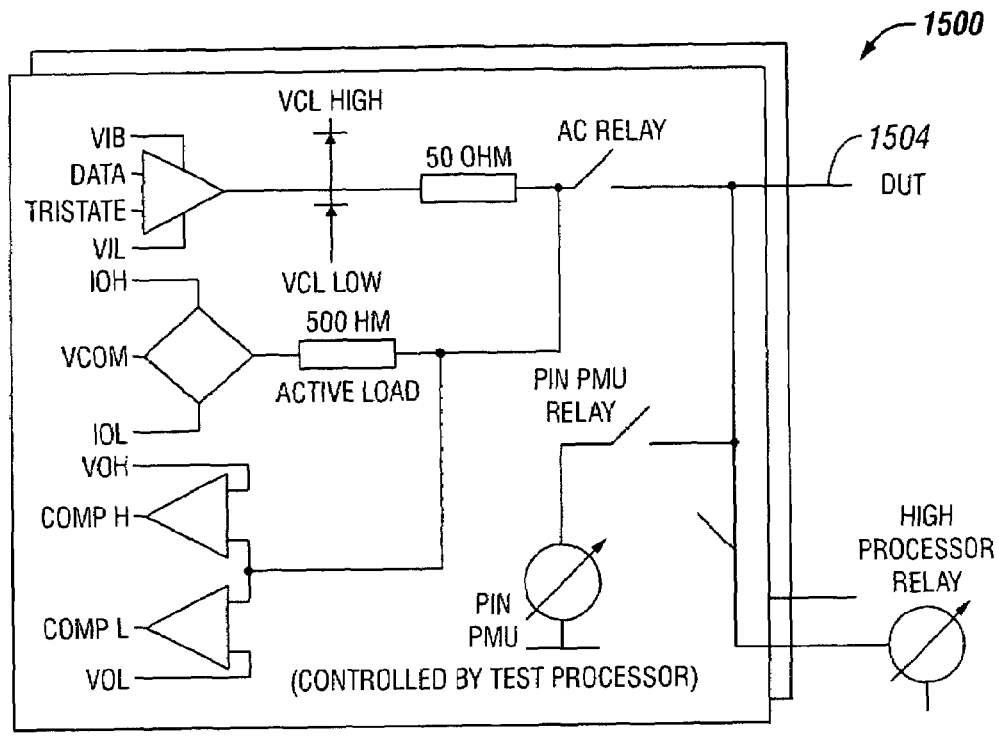
FIG. 15 illustrates a relay of a conventional pin electronics card of a typical tester, for electrically disconnecting/turning-off the test resources of the tester channel therefor, according to certain embodiments of the invention.

Referring to FIG. 12, a timing diagram 1200 illustrates testing cycles for respective first and second devices (i.e., DUT1 and DUT2) in a test system of the type described herein. It is notable in the timing diagram 1200 that index times are negligible, because the manipulator, via dual manipulator arms, can manipulate one device while the other device is being tested, and vice versa. Thus, at each instant, a device for testing is located in a socket for testing, and the system switches the test between devices in order to at each such instant continue testing for the device so readied for testing. Once testing of a device is completed, the other device can be immediately tested, upon switching of the test to the next device.

Pin Electronics Card Including Muxing Relay

Figure 16:
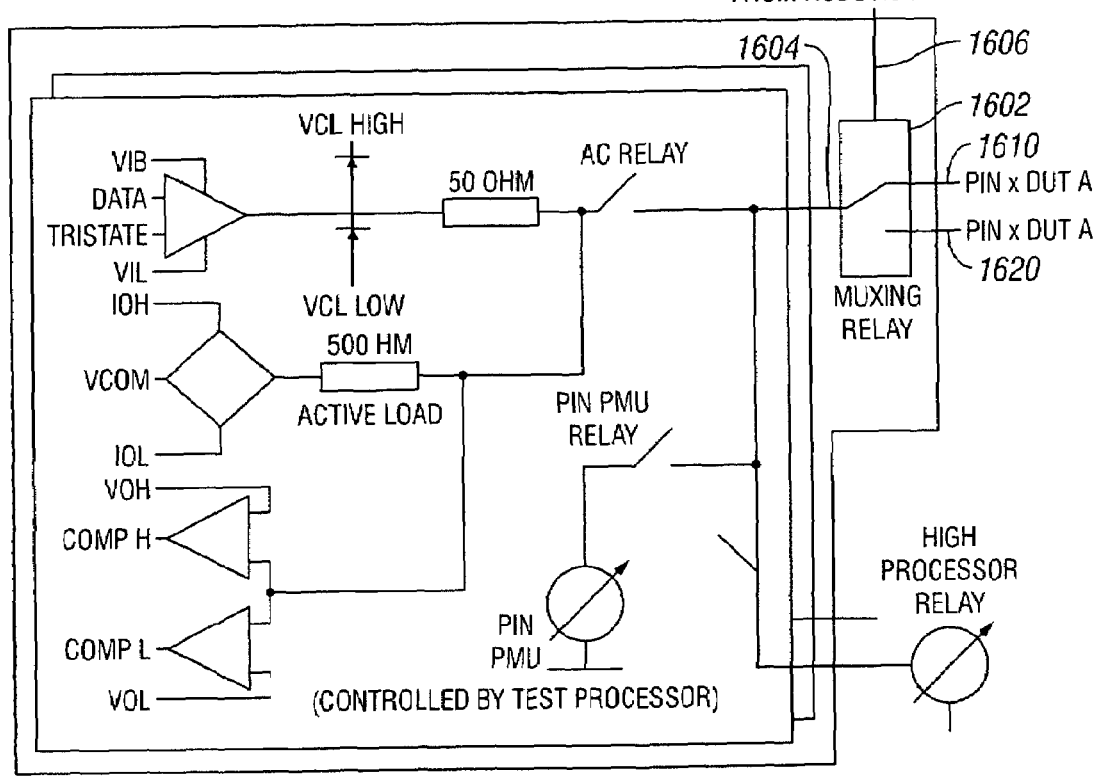
FIG. 16 illustrates a muxing relay of a pin electronics card of the present invention, the muxing relay being included in the pin electronics card and connected to a tester channel (i.e., a particular set of tester resources) of the card, providing dual leads for connection of the tester channel to equivalent pins of two separate devices (the "equivalent pins" being the same pin of the same type/model, etc. of two separate devices), the dual leads being trace length matched, according to certain embodiments of the invention.

Referring to FIG. 16, a pin electronics card 1600 of certain embodiments includes a muxing relay 1602. The muxing relay 1602 switches electronics of a tester channel 1604 of the card 1600 between two separate leads 1610 and 1620. The separate leads 1610 and 1620 are connected to an equivalent pin of two separate DUTs (i.e., DUTA and DUTB, not shown in detail).

The muxing relay 1602 is also connected to a switch control signal 1606. The switch control signal 1606 is connected to the handler (not shown, but previously described herein). The handler, as previously discussed, can provide control signals to the tester for testing of a DUT in place in a test socket of an interface board. Alternately, control signals can be from another source, manually directed by an operator, or otherwise.

In operation, the handler can handle two separate devices under test, DUTA and DUTB, to place and replace the devices in dual test sockets of the tester in the test site. The dual test sockets are operationally equivalent, at least with respect to the equivalent pin connection for devices under test and inserted into the sockets. For example, with DUTA in one of the sockets, the muxing relay 1602 is controlled by signal from the handler to switch electronic test resources of the tester channel to the socket containing DUTA. The tester channel is thereby electrically connected to a single pin of the DUTA, as applicable for testing by the tester.

During the testing of DUTA, the DUTB is located in the other of the sockets by the handler. Once testing of DUTA is completed, then the muxing relay 1602 is controlled by signal of the handler to switch electronic test resources of the tester channel to the socket containing DUTB. The tester channel thereby electrically connects to the equivalent single pin of the DUTB for testing that device.

During the testing of DUTB, a next device under test is retrieved by the handler and replaced in the socket that contained DUTA, and the process continues.

Of course, dual manipulators, as previously described, can serve to perform the ready placement in one socket while testing a device in the other socket.

Further referring to FIG. 16, the muxing relay 1602, although illustrated for example purposes as a last component from the pin electronics card 1600 providing the leads 1610, 1620 to DUTA and DUTB, can instead be configured/located in the pin electronics card 1600 at any appropriate connection. For example, so long as the muxing relay 1602 is effective to perform the muxing function as described, the muxing relay 1602 can alternately be connected within the other components/elements of the pin electronics card 1600. The particular configuration/location can optimize for minimal disturbance to signal integrity, for card manufacture or economics, or otherwise.

Moreover, the leads 1610, 1620 from the tester channel 1604 of the pin electronics card 1600 are preferably trace length matched. Trace length matching of the leads 1610, 1620, as will be known and understood by those skilled in the art, enables the same testing via the tester channel over the leads 1610, 1620, without any calibrations or corrections. For example, control of testing is provided by the handler. If traces are not matched in length, then the tester and/or handler must measure and implement different sets of calibration data for testing at the respective sockets. This would be complicated and likely would be costly in design and implementation. However, trace length matching of the leads 1610, 1620 is not necessarily required, and software or other elements of the tester and/or handler could provide for applicable and appropriate testing with the respective sockets, as desired, in other configurations.

The particular pin electronics of the tester channel 1604 can be digital or analog, or anything else. In any event, the tester channel 1604 is switchable among dual leads in order to electrically switch between equivalent pins of separate devices with negligible index time.

Particular design of the muxing relay 1600 depends on many factors in any particular configuration of tester, pin electronics card, testing, handler, and so forth. Design can account for different signals or signals where the signal and its differential counterpart or ground reference must be switch in a manner to maintain consistent impedance or maintain a minimum current loop, etc. In any such design, however, the base concept of connecting with one pin translated into two remains the same, and it makes no difference the particular electrical nature for the connection with the pin (e.g., doesn't matter if ground, digital signal, analog signal, differential signal or other). Those skilled in the art will understand and know various design possibilities, options, and approaches in any particular implementation, and all of these are intended as included here.

Figure 17:
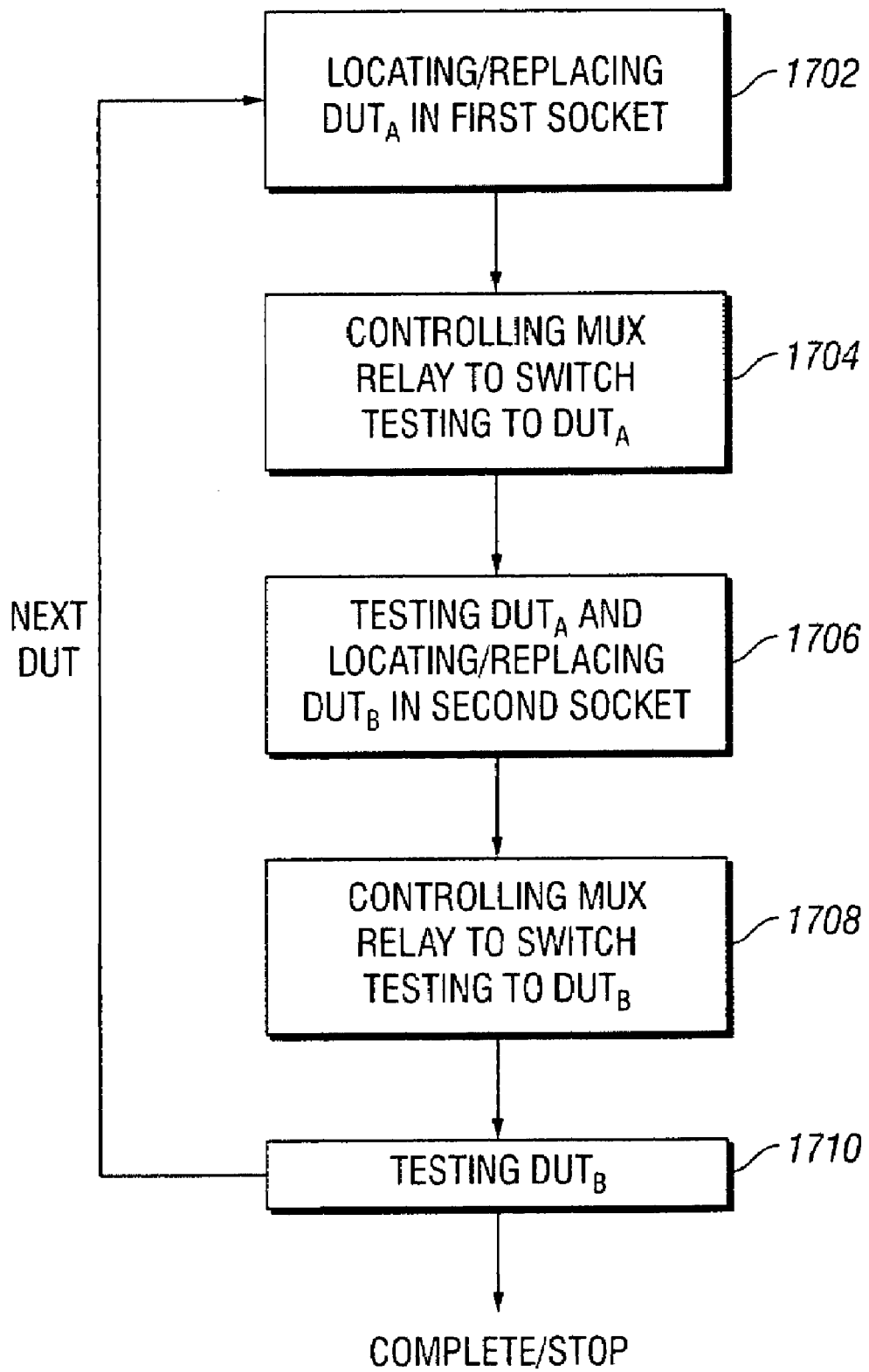
FIG. 17 illustrates a method for testing by the pin electronics card of FIG. 16 having the muxing relay and dual leads of the tester channel, those dual leads being connectable to an equivalent pin of two separate devices, wherein the muxing sequentially switches the tester channel to each next device, via switching electrically between the dual leads, with negligible index time between testing of one device and testing of the next device, according to certain embodiments of the invention.

Referring to FIG. 17, a method 1700 performs testing via dual leads connected to a tester channel providing a set of test resources. In the method 1700, a first pin of a DUT (i.e., DUTA) is connected in a step 1702 to one of the leads, by a handler of a tester locating the DUTA in a test socket. The handler, in a step 1704, signals to the mux relay of the pin electronics card of the tester to switch testing to the one of the leads connecting the pin of DUTA. As the testing of DUTA is proceeding, the handler (as previously discussed, via another manipulator or as otherwise applicable) in a step 1706 (corresponding to the handler operations in the method 500, above) dispositions any device in another test socket of equivalent testing functionality, retrieves a next device (i.e., DUTB), and locates the DUTB in the other test socket. The DUTB is, therefore, generally already located in the other test socket at completion of the testing of DUTA.

The handler, in a step 1708, controls the muxing relay to switch testing to the other of the leads connecting the DUTB in the other test socket, upon completion of testing of the DUTA in the first test socket, and signals the tester to commence testing of DUTB. Testing of DUTB, via the tester channel and the lead connected to the single equivalent pin of the DUTB, proceeds in a step 1710.

During testing of DUTB, the handler next returns to the step 1702, by dispositioning the DUTA, placing the DUTA in a "test completed" location, retrieving a next device under test to replace the DUTA, and positioning this next device in the stead of the DUTA in the socket that held DUTA. The method 1700 continues until testing is completed for all devices, or until some other interrupting mechanism occurs (e.g., as previously mentioned, testing could be halted by an operator, because of error, etc.).

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems and any element(s) that may cause any benefit, advantage, or solution to occur or become more pronounced are not to be construed as a critical, required, or essential feature or element of any or all the claims. As used herein, the terms "comprises, "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for testing a plurality of devices-under-test, the system including a tester having a test resource for performing a distinct test and a pin electronics card, comprising:
   a first pin of the pin electronics card;
   a second pin of the pin electronics card;
   a muxing relay of the pin electronics card, connected to the tester resource and to the first pin and the second pin in parallel for operative switching of the tester resource between application to either of the first pin and the second pin;
   a handler connected to the tester, having a first manipulator and a second manipulator, the handler controls the mux relay to operatively switch testing by the tester resource to either of the first pin and the second pin, according to the handler's detection of a device-under-test positioned for testing in either of the first pin and the second pin, respectively;
   wherein, during testing at the first pin, the first manipulator maintains a device-under-test in connection to the first pin for testing, and the second manipulator, during testing at the first pin, disconnects from the second pin any device-under-test then having just been tested at the second pin; and, during testing at the second pin, the second manipulator maintains a next device-under test in connection to the second pin for testing, and the first manipulator, during testing at the second pin, disconnects from the first pin any device-under-test then having just been tested at the first pin;
   a test initiator generated by the handler upon the handler's detection that a device-under-test is then positioned for testing in connection to either of the first pin and the second pin, wherein the tester commences testing via the test resource in response to the test initiator of the handler;
   wherein, at each instant during testing operations by the tester for the plurality of devices-under-test, the test resource, via the operative switching of the muxing relay by the handler according to the handler's detection that the handler then maintains one of the plurality of the devices-under-test in position for next testing at either the first pin and the second pin, respectively, tests at either of the first pin and the second pin, in substantially immediate index-less succession at each instant, for all of the plurality of devices-under-test, unless and until the testing is interrupted.

2. The system of claim 1, further comprising:
   a controller of the handler connected to the muxing relay and the tester for operatively switching the muxing relay to apply the test resource of the tester, respectively and successively, to the first pin and the second pin;
   wherein the test initiator of the handler controls the tester to commence testing via the test resource when the handler determines that either of the first manipulator and the second manipulator then maintain a device-under-test in connection to either of the first pin and the second pin, respectively, for next testing.

3. The system of claim 2, further comprising:
   a relay of the pin electronics card connected to the handler and to the mux relay as input, for disconnecting the test resource to the mux relay
   in response to state of the handler connected to the tester.

4. The system of claim 3, further comprising:
   a first test socket of the pin electronics card, including the first pin;

a second test socket of the pin electronics card, including the second pin;

wherein the first manipulator operates in conjunction with the first test socket to maintain one of the devices-under-test in the first test socket for testing via the test resource, and the second manipulator operates in conjunction with the second test socket to maintain a next one of the devices-under-test in the second test socket for testing via the test resource, for substantially immediate index-less succession at one of either the first test socket and the second test socket, respectively, at each instant, repeating testing at each of the first test socket and the second socket in succession for the plurality of devices-under-test.

5. The system of claim 1, wherein the testing at one of the first pin and the second pin, respectively, in succession by the tester resource is asynchronous in time and substantially identical in testing functionality.

* * * * *